(12) United States Patent
Kamphuis et al.

(10) Patent No.: US 10,593,635 B2
(45) Date of Patent: Mar. 17, 2020

(54) MULTI-DIE AND ANTENNA ARRAY DEVICE

(71) Applicant: NXP B.V., Eindhoven (NL)

(72) Inventors: Antonius Hendrikus Jozef Kamphuis, Lent (NL); Paul Southworth, Groesbeek (NL); Keith Richard Sarault, Nijmegen (NL); Marcellinus Johannes Maria Geurts, Amsterdam (NL); Jeroen Johannes Maria Zaal, Nijmegen (NL); Johannes Henricus Johanna Janssen, Venray (NL); Amar Ashok Mavinkurve, Malden (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/937,278

(22) Filed: Mar. 27, 2018

(65) Prior Publication Data

US 2019/0304934 A1  Oct. 3, 2019

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4853* (2013.01); *H01L 21/561* (2013.01);
(Continued)

(58) Field of Classification Search
CPC ..... H01L 23/66; H01L 21/561; H01L 23/427; H01L 23/5386; H01L 21/4853; H01L 21/565; H01L 21/568; H01L 23/3128; H01L 24/96; H01L 24/19; H01L 24/20; H01L 23/5389; H01L 2223/6677; H01L 2223/6627; H01L 2224/214; H01L 2224/95001; H01P 5/16; H01Q 1/2283
(Continued)

(56) References Cited

U.S. PATENT DOCUMENTS 6,951,769 B2  10/2005 Malone
7,169,649 B2  1/2007 Rosa et al.
(Continued)

FOREIGN PATENT DOCUMENTS

DE  102013111569 A1  4/2014

OTHER PUBLICATIONS

Sadhu, Bodhisatwa, "Enabling 5G: mmWave Silicon Integration and Packaging," IBM Research, J.T. Watson Research Center, IBM Corporation 2015, 31 pages.
(Continued)

*Primary Examiner* — Anthony Ho
*Assistant Examiner* — Mohammad M Hoque
(74) *Attorney, Agent, or Firm* — Charlene R. Jacobsen

(57) ABSTRACT

Embodiments are provided for a multi-die packaged semiconductor device including: a panel of embedded dies including a plurality of radio frequency (RF) dies, wherein each RF die includes RF front-end circuitry, each RF die has an active side that includes a plurality of pads, each RF die has a back side exposed in a back side of the panel; a plurality of antenna connectors formed on a subset of the plurality of pads of each RF die; and an array of antennas formed over a front side of the panel and connected to the plurality of antenna connectors.

19 Claims, 20 Drawing Sheets

(51) Int. Cl.

| | |
|---|---|
| *H01L 21/56* | (2006.01) |
| *H01L 23/31* | (2006.01) |
| *H01L 23/427* | (2006.01) |
| *H01L 23/538* | (2006.01) |
| *H01L 23/00* | (2006.01) |
| *H01P 5/16* | (2006.01) |
| *H01Q 1/22* | (2006.01) |
| *H01Q 21/00* | (2006.01) |
| *H01Q 1/52* | (2006.01) |
| *H01L 23/522* | (2006.01) |

(52) U.S. Cl.
CPC .......... *H01L 21/565* (2013.01); *H01L 21/568* (2013.01); *H01L 23/3128* (2013.01); *H01L 23/3171* (2013.01); *H01L 23/427* (2013.01); *H01L 23/5227* (2013.01); *H01L 23/5386* (2013.01); *H01L 23/5389* (2013.01); *H01L 24/19* (2013.01); *H01L 24/20* (2013.01); *H01L 24/96* (2013.01); *H01P 5/16* (2013.01); *H01Q 1/2283* (2013.01); *H01Q 1/523* (2013.01); *H01Q 21/00* (2013.01); H01L 24/13 (2013.01); H01L 2223/6627 (2013.01); H01L 2223/6677 (2013.01); H01L 2224/04105 (2013.01); H01L 2224/12105 (2013.01); H01L 2224/13101 (2013.01); H01L 2224/14133 (2013.01); H01L 2224/16225 (2013.01); H01L 2224/214 (2013.01); H01L 2224/95001 (2013.01); H01L 2924/18162 (2013.01)

(58) Field of Classification Search
USPC ........................................................ 257/428
See application file for complete search history.

(56) References Cited

U.S. PATENT DOCUMENTS

| | | | |
|---|---|---|---|
| 7,675,466 B2 | 3/2010 | Gaucher et al. | |
| 7,768,457 B2 | 8/2010 | Pettus et al. | |
| 7,932,615 B2 | 4/2011 | Rinne | |
| 8,004,092 B2 | 8/2011 | Lin et al. | |
| 8,148,806 B2 | 4/2012 | Lin et al. | |
| 8,580,672 B2 | 11/2013 | Kuechenmeister et al. | |
| 8,909,135 B2* | 12/2014 | McCormack | H04B 1/18 455/39 |
| 8,940,998 B2 | 1/2015 | Babayan et al. | |
| 9,012,326 B2 | 4/2015 | Kim et al. | |
| 9,543,262 B1 | 1/2017 | Koutney, Jr. | |
| 9,630,834 B2 | 4/2017 | Tayebi et al. | |
| 9,991,216 B2* | 6/2018 | Liao | H01L 23/66 |
| 10,096,558 B1* | 10/2018 | Chiang | H01L 21/6835 |
| 2006/0049995 A1* | 3/2006 | Imaoka | H01Q 1/22 343/702 |
| 2006/0290444 A1 | 12/2006 | Chen | |
| 2007/0026567 A1* | 2/2007 | Beer | G01S 7/032 438/106 |
| 2008/0029886 A1 | 2/2008 | Cotte et al. | |
| 2009/0009007 A1* | 1/2009 | Kato | G06K 19/0701 307/104 |
| 2009/0096589 A1* | 4/2009 | Kuehl | H01L 21/67248 340/10.52 |
| 2009/0289343 A1* | 11/2009 | Chiu | H01L 23/3128 257/690 |
| 2010/0193935 A1* | 8/2010 | Lachner | H01Q 1/2283 257/693 |
| 2011/0127665 A1 | 6/2011 | Hsu | |
| 2011/0163457 A1* | 7/2011 | Mohan | H01L 21/4853 257/774 |
| 2013/0285763 A1 | 10/2013 | Granger-Jones et al. | |
| 2014/0035097 A1* | 2/2014 | Lin | H01L 23/552 257/531 |
| 2014/0062787 A1* | 3/2014 | Nazarov | G06K 19/07372 342/378 |
| 2014/0110841 A1* | 4/2014 | Beer | H01L 23/49822 257/738 |
| 2014/0168014 A1* | 6/2014 | Chih | H01Q 1/2283 343/700 MS |
| 2014/0374251 A1* | 12/2014 | Soccol | G01N 27/302 204/415 |
| 2015/0177373 A1* | 6/2015 | Boeck | G01S 7/02 342/52 |
| 2015/0280327 A1* | 10/2015 | Spella | H01Q 19/10 342/5 |
| 2015/0348920 A1 | 12/2015 | Yap et al. | |
| 2016/0178730 A1* | 6/2016 | Trotta | G01S 7/006 342/175 |
| 2017/0278808 A1* | 9/2017 | Liao | H01L 23/66 |
| 2017/0346185 A1* | 11/2017 | Wang | H01Q 1/36 |
| 2018/0159203 A1* | 6/2018 | Baks | H01Q 1/2283 |
| 2018/0191052 A1* | 7/2018 | Ndip | H01L 23/552 |
| 2018/0191053 A1* | 7/2018 | Ndip | H01L 23/552 |
| 2018/0240762 A1* | 8/2018 | Kamgaing | H01L 25/16 |

OTHER PUBLICATIONS

Bouavadi et al., "3D Integration and Packaging of mmWave Circuits and Antennas: Opportunities and Challenges," http://www.microwavejournal.com/articles/25892-d-integration-and-packaging-of-mmwave-circuits-and-antennas-opportunities-and-challenges, Feb. 12, 2016, 9 pages.

U.S. Appl. No. 15/864,425, filed Dec 19, 2017, 46 pages.

* cited by examiner

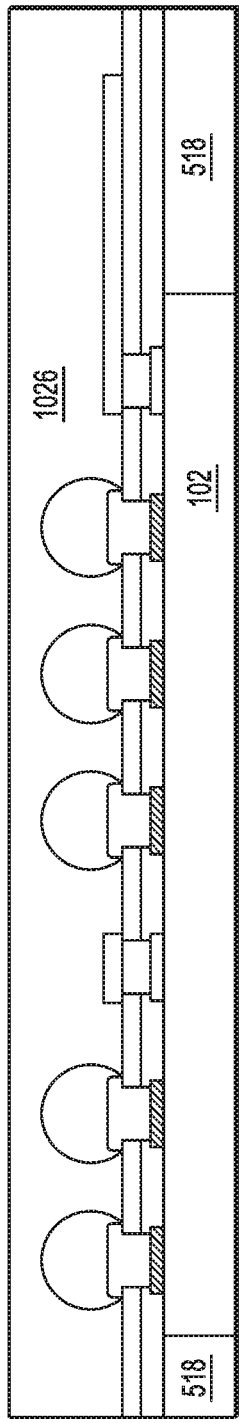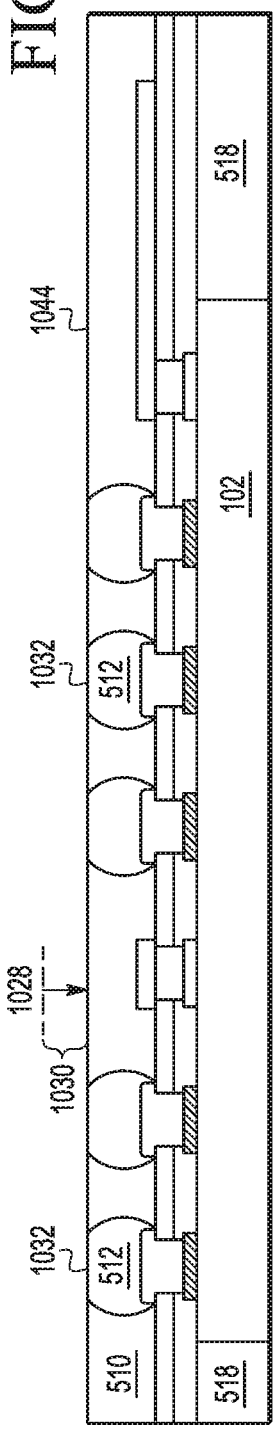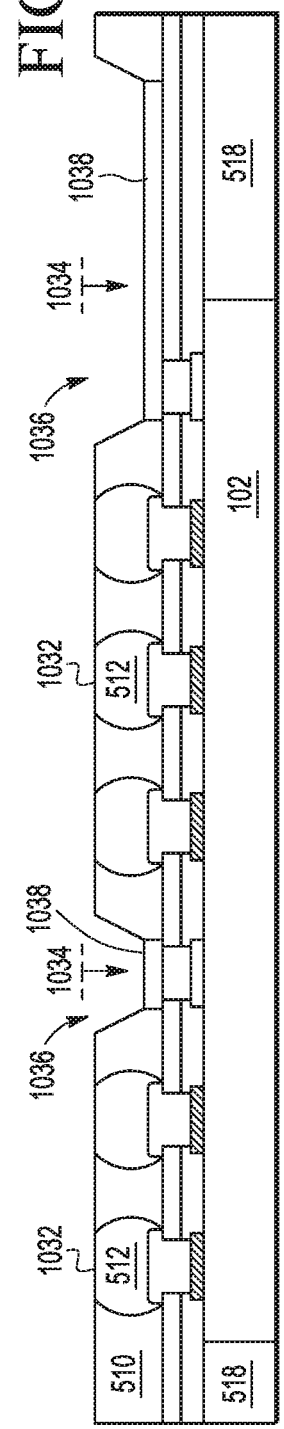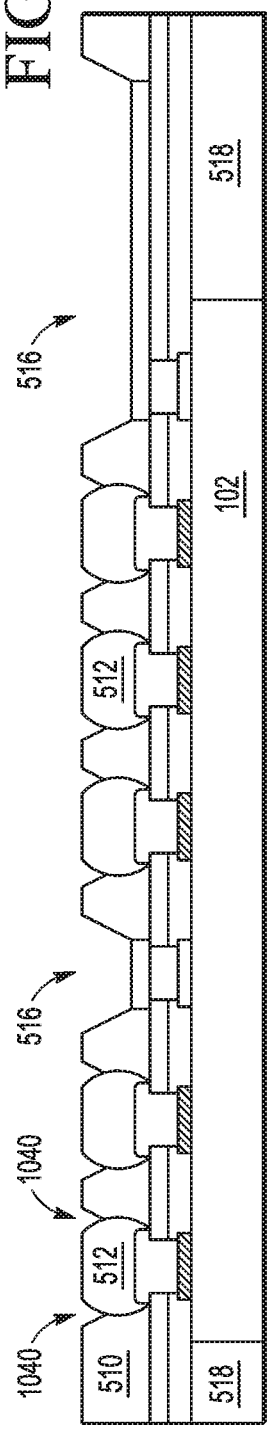

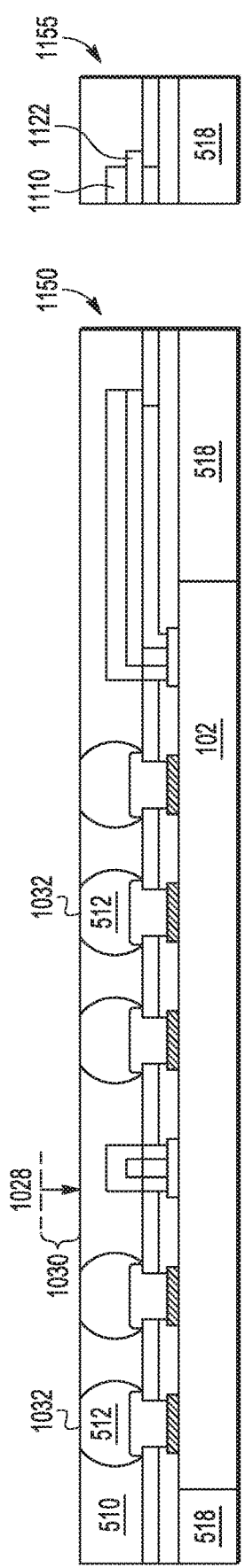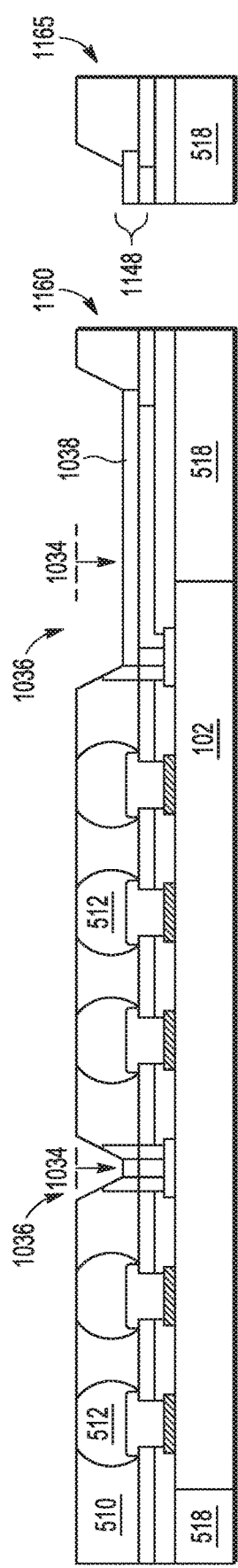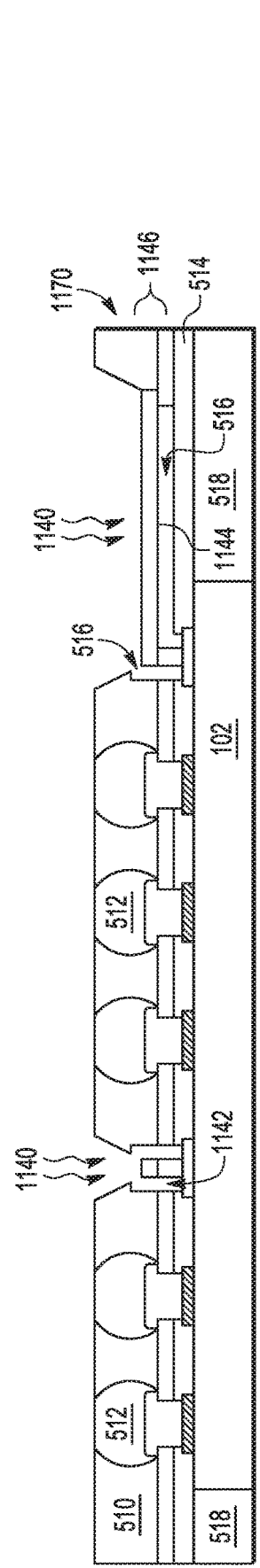

MULTI-DIE AND ANTENNA ARRAY DEVICE

BACKGROUND

Field

This disclosure relates generally to wireless communication, and more specifically, to providing a packaged semiconductor device that includes an array of multiple die and an array of antennas for wireless communication.

Related Art

Wireless communication is used in a variety of applications for data transfer, such as mobile telephone service. Wireless communication has made advances in increasing the amount of data transferred, such as by moving to new technologies that use multi-in, multi-out (MIMO) technology, phased arrays like Active Electronically Scanned Arrays (AESA), and frequencies around 30 GHz having a corresponding wavelength expressed in single digit millimeters (mmWaves).

BRIEF DESCRIPTION OF THE DRAWINGS

The present invention may be better understood, and its numerous objects, features, and advantages made apparent to those skilled in the art by referencing the accompanying drawings.

FIG. 10A-10L are block diagrams depicting an example process flow for creating a packaged semiconductor device that includes a panel of multiple RF die and an array of antennas, according to some embodiments of the present disclosure.

FIG. 11A-11M are block diagrams depicting another example process flow for creating a packaged semiconductor device that includes a panel of multiple RF die and an array of antennas, according to some embodiments of the present disclosure.

Figure 1:
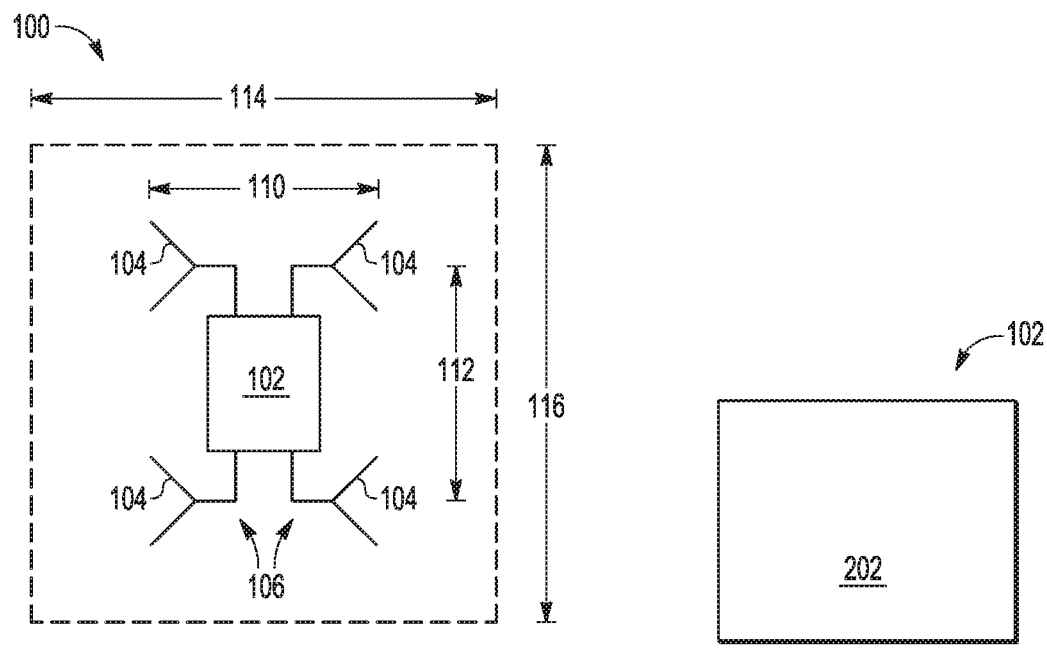
FIGS. 1, 2, 3, 4A, 4B, 5A, 5B, and 5C are block diagrams depicting components of an example radio frequency (RF) cell including an RF die coupled to a set of antennas, according to some embodiments of the present disclosure.

The present invention is illustrated by way of example and is not limited by the accompanying figures. Reference numerals in the figures having a same value indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Overview

MIMO (multi-in, multi-out) technology is an important technology for implementing advanced wireless communication, such as for 5G (5th generation) networks. An array of antennas is used to achieve large data transfer, where the antennas are controlled by a number of radio frequency (RF) die. As the number of antennas implemented in an array increases, so does the number of RF dies needed in a wireless communication device. However, the RF dies in aggregate generate a great amount of heat, and requires a thermal transfer solution. The thermal performance of a wireless communication device is presently a limiting factor for the number of RF dies implemented in a single wireless communication device, which in turn limits the data transfer capabilities of the wireless communication device.

Further, a customer conventionally attaches each RF die individually on a printed circuit board (PCB) having an array of antennas to form a wireless communication device. As the number of RF dies implemented in such a device increases, so does the risk of non-planarity among the RF dies. For example, each RF die may have some degree of tilt or variations in the solder bump height when attached to the PCB. The non-planarity of the RF dies may limit the thermal transfer from the (non-planar) sides of each RF die to a planar surface of a heat sink or spreader. While such tilt or variations may be compensated with a thick thermal interface material, the larger thickness increases the thermal conductivity path from the RF dies to the heat sink and reduces thermal performance. Further, the RF dies may be connected to the array of antennas through a number of solder balls, which may contribute to signal degradation. Such degradation is often worse when the solder balls are surrounded by mold compound material.

The present disclosure provides embodiments of packaged semiconductor devices and embodiments of fabricating such devices that include both an array of RF dies and an array of antennas, where such devices may include hundreds of dies and hundreds of antennas. The presently disclosed device includes an array of antennas formed over an active side of a panel of embedded RF dies, where each RF die is connected to a set of antennas. In order to improve RF performance, dielectric material is removed to form cavities adjacent to the antennas to expose at least an outer surface of the antennas to the ambient environment (e.g., free space). In some embodiments, the cavities may be formed around each antenna, providing air gaps above, below, and lateral to each antenna.

The active side of the panel includes both the array of antennas and a number of signal pads configured to be attached to a number of solder balls that in turn are configured to be attached landing pads on a printed circuit board (PCB) by solder bumps, solder balls, or other solder attachment mechanism. In some embodiments, underfill may be used in the vicinity of the solder bumps or solder balls to improve mechanical robustness. In some embodiments, an array of splitter dies may optionally be included in the panel, where a number of solder balls connect the splitter dies to RF signal lines in the PCB, which are further connected to RF dies via solder balls. In other embodiments an array of active circuits (e.g., conductive traces forming RF signal lines) implementing splitter functionality may be optionally included in an RDL (redistributed layer) structure of the device to minimize the number of (solder ball) transitions between the PCB and the device for improved RF performance.

The device also has a planar back surface that can be attached to a cooling system, such as a heat pipe or other heat transfer mechanism, where a thinned back side of each RF die is exposed in the planar back surface. A direct thermal conductivity path is formed between each die and the cooling system to dissipate more power in the presently included RF dies for improved thermal performance, which also increases the life span of the presently disclosed device (e.g., due to lower operating temperature). Improved thermal performance may also allow additional RF dies to be included in the presently disclosed device, providing for increased RF power capability.

The present disclosure may be especially beneficial for devices that implement an operating frequency at microwave frequencies or millimeter frequencies (or frequencies that have millimeter wavelengths), although not limited to such wireless or radio frequency applications. The packaged semiconductor devices disclosed herein may be implemented in wireless communication devices, such as routers, base stations for cell phone systems, network devices that implement wireless communication (e.g., 5G), and the like, although not limited to such applications.

Example Embodiments

FIG. 1 illustrates an example radio frequency (RF) cell 100, which includes an RF die 102 configured to process RF signals at an operating frequency, which has a wavelength or lambda ($\lambda$). Examples of operating frequencies include but are not limited to frequencies that generally fall in a range of 20 kHz to 300 GHz, such as a band centered on 13.56 MHz, a band centered on 3.6 GHz, a band centered on 5 GHz, or a band centered on 60 GHz. RF die 102 may include RF front-end circuitry, which implements front end components of a transmitter, a receiver, or both, as further discussed below in connection with FIG. 2.

Figure 2:
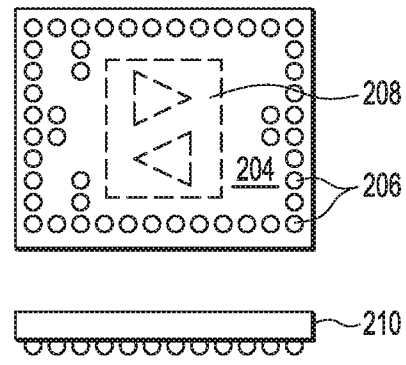

FIG. 2 shows a back side 202, an active side (or front side) 204, and a lateral side 210 of an RF die 102, which is also referred to as a flip chip die that is configured to be connected to a PCB or other substrate in a face-down orientation (e.g., active side facing the PCB). The active side 204 of RF die 102 includes active circuitry having signal paths routed to signal pads on the active side 204, and the back side 202 (e.g., bulk silicon) is opposite the active side 204. In the embodiment shown, a plurality of solder bumps 206 are attached to the signal pads on the active side 204. While the solder bumps 206 are shown attached to signal pads arranged in rows generally around the periphery of the die 102, the solder bumps 206 may be attached to signal pads arranged in other shapes and in other areas on the die 102. The active circuitry also includes an RF-sensitive area 208, which is shown in dashed outline in FIG. 2. The RF-sensitive area 208 may include front-end circuitry (also shown in dashed outline) that includes a transmitter circuit, a receiver circuit, or both as a transceiver circuit. The front-end circuitry may include but is not limited to a transmitter power amplifier, a receiver low noise amplifier, one or more baluns, one or more filters, a circulator or other coupling device to the antenna, impedance matching elements, a local oscillator, a phase locked loop, a resonance frequency circuit (e.g., one or more resistors and capacitors), control logic, and other appropriate front-end elements. The active circuitry may also include a power splitter for dividing an RF signal to transmit on one or more antennas connected to the RF die, a power combiner for combining RF signals received on one or more antennas, or both.

Returning to FIG. 1, the RF die 102 of the RF cell 100 is coupled to a set of antennas 104 by respective interconnects 106, where the RF die 102 may provide an RF signal to each antenna 104 for transmission (e.g., output by a transmitter circuit in area 208), may receive an RF signal from each antenna 104 (e.g., input to a receiver circuit in area 208), or both. In the embodiments discussed herein, the set of antennas 104 includes 4 antennas, but other numbers of antennas may be implemented in other embodiments (e.g., 2, 6, 8). The RF die 102 may be configured to implement a MIMO (multi-in, multi-out) technique that uses multiple transmit and receive antennas for multipath propagation. In the embodiments discussed herein, the antennas 104 are implemented within a packaged semiconductor device that includes the RF die 102. The packaged semiconductor device may be attached to a printed circuit board (PCB) or other carrier, for example, using (but not limited to) solder paste or other attachment, as further discussed in connection with FIGS. 5B and 5C.

The set of antennas 104 are arranged in an array of rows and columns (e.g., 2×2) having a horizontal or row pitch 110 in the row direction (e.g., in the left and right directions of the page) and a vertical or column pitch 112 in the column direction (e.g., in the top and bottom directions of the page). In some embodiments, the row pitch 110 and the column pitch 112 are based on the wavelength ($\lambda$) of the operating frequency and the size of the antennas 104. Examples of the row pitch 110 and the column pitch 112 include but are not limited to one-lambda ($\lambda$), half-lambda ($\lambda/2$), quarter-lambda ($\lambda/4$), three-quarter-lambda ($3\lambda/4$), or four-lambda pitches ($4\lambda$). The selection of the pitches 110 and 112 is dependent on various factors including but not limited to mutual coupling (which is generally inversely proportional to separation or pitch between the antennas 104) and the appearance of grating lobes (which may appear as a source of interference and power loss). In some embodiments, the row pitch 110 and the column pitch 112 may have the same pitch value to provide an antenna array having uniform pitch in both row and column directions. In other embodiments, the row pitch 110 and the column pitch 112 may have different pitch values, such as half-lambda and three-quarter-lambda pitches.

Figure 3:
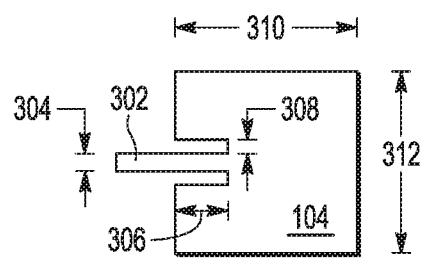

FIG. 3 shows an example rectangular antenna 104, which has a length 310 and a width 312. In some embodiments, the length 310 is equal to the width 312 to provide a square-shaped patch antenna, although the length 310 may be different than the width 312 in other embodiments. The length 310 and width 312 (whether having the same value or different values) are generally based on the wavelength ($\lambda$) of the operating frequency, and may take into account the dielectric constant of the PCB or other surrounding dielectric material (e.g., package mold body) through which the RF signal is transmitted or received. Examples of the length 310, width 312, or both include but are not limited to one-lambda ($\lambda$), half-lambda ($\lambda/2$), quarter-lambda ($\lambda/4$), three-quarter-lambda ($3\lambda/4$), or four-lambda ($4\lambda$) lengths. In some embodiments, the antenna 104 may be a quarter-wave element and uses a ground plane in the PCB as a counterpoise to form a half-wave dipole.

Figure 4A:
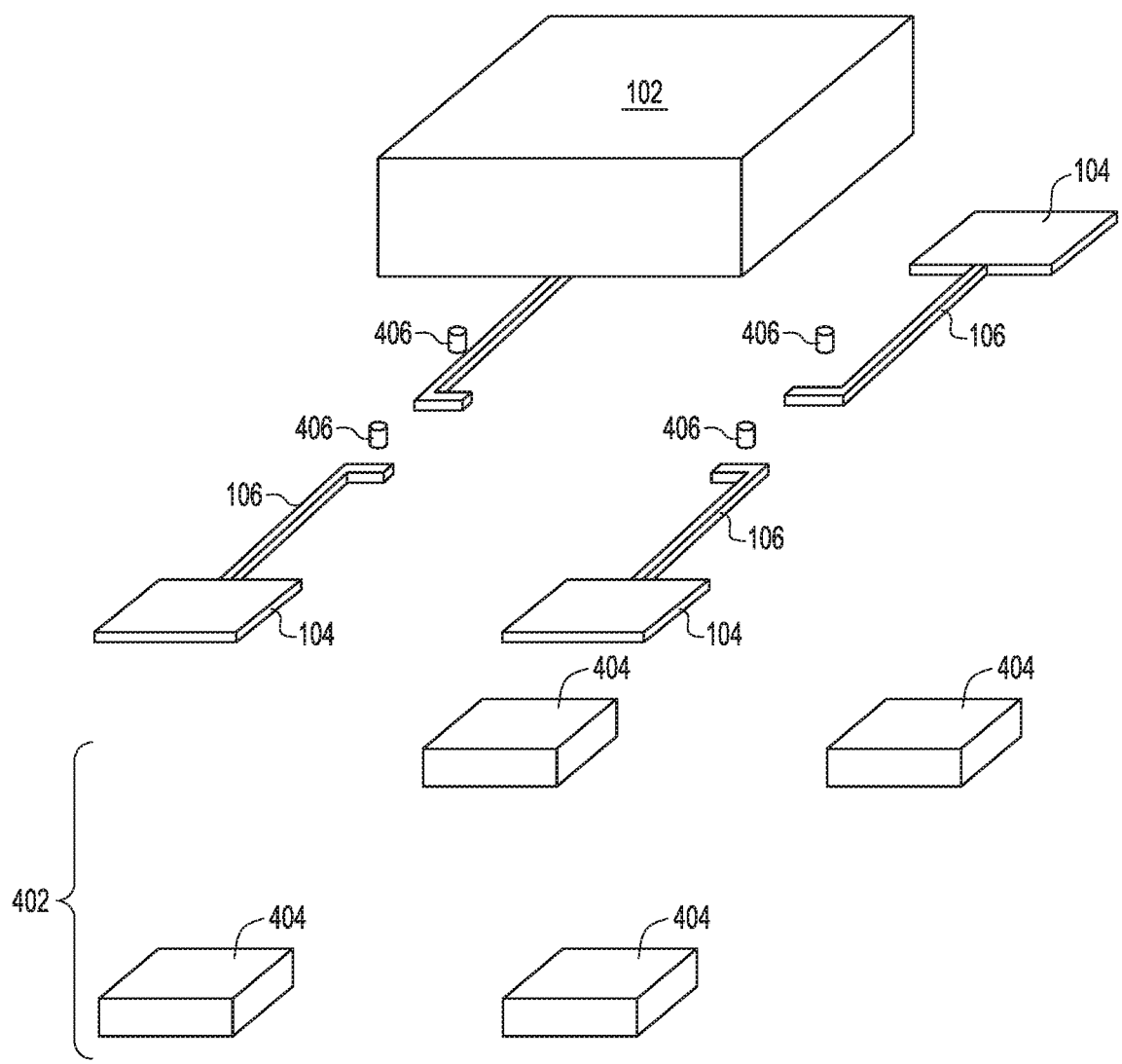
Figure 4B:
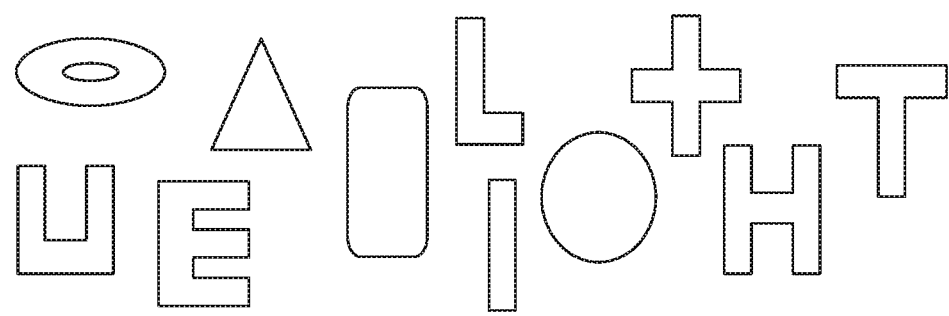

Example shapes of antenna 104 include but are not limited to the example shapes shown in FIG. 4B. Such shapes similarly have a length 310 and width 312 (e.g., measured in perpendicular directions). The example shapes shown in FIG. 4B include an elliptical shape (e.g., a solid non-ringed shape), which in some embodiments may also include a hole to form an elliptical ring, a U-shape, an E-shape, a triangular shape, a rectangular shape, an L-shape, a rod shape (e.g., for a monopole or dipole element), a circular shape, a cross shape, an H-shape, and a T-shape. Additional example shapes of antenna 104 include other polygonal shapes (e.g., inverted-L shape, inverted-F shape), cylindrical shapes (e.g., helical or spiral shape), amorphous shapes generally having a continuous area, shapes including holes (e.g., to form a ring or sectional shape), and the like.

Returning to FIG. 3, antenna 104 is attached to interconnect 106 by a microstrip transmission line 302 having a width 304. The microstrip 302 can be tuned or matched to the antenna 104 (regardless of the shape of antenna 104) by the dimensions of the gap separating the microstrip 302 from the surrounding antenna 104, such as gap spacing 308 and the length 306 of the gap.

Figure 5A:
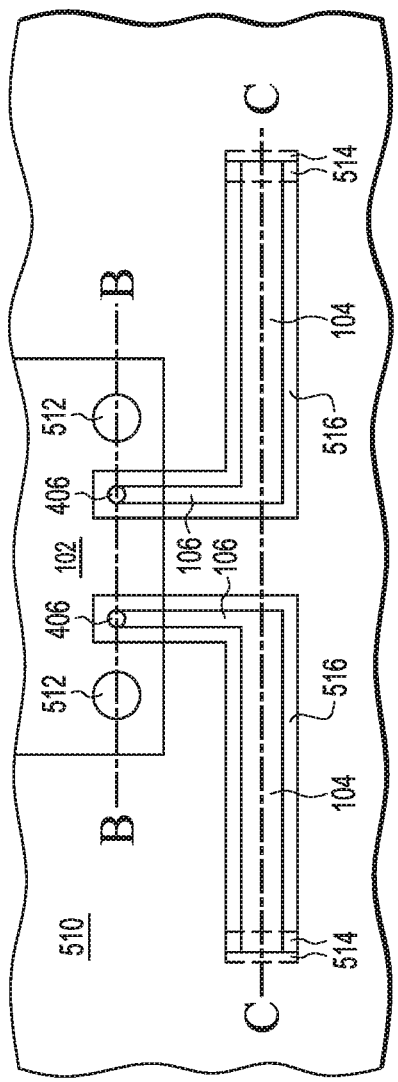
Figure 5B:
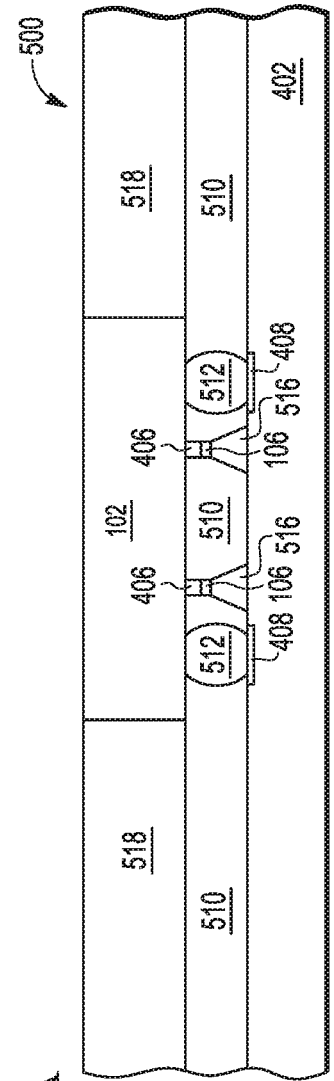
Figure 5C:
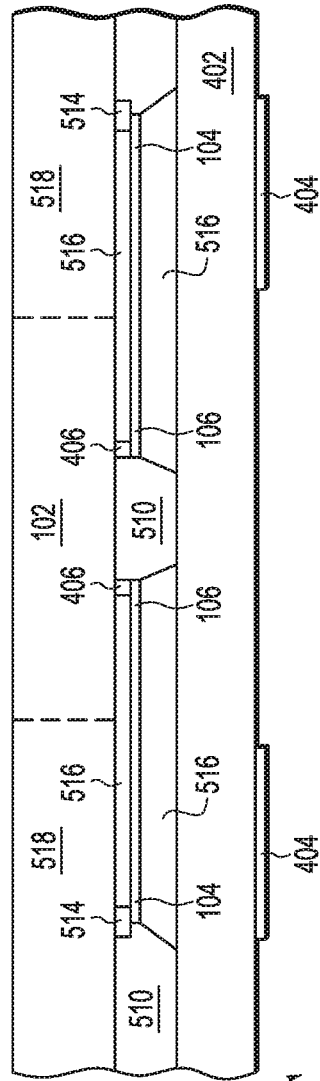

FIG. 4A shows an example exploded view of an example RF cell 100 that includes the RF die 102, the interconnects 106, and the antennas 104. As discussed herein, the RF die 102, the interconnects 106, and the antennas 104 are implemented in an integrated packaged semiconductor device, which may be attached to a printed circuit board (PCB) 402. Various views of such an integrated packaged semiconductor device are shown in FIGS. 5A, 5B, and 5C. Each antenna 104 is connected to an interconnect 106 that in turn is connected to pads on the RF die 102 through connectors 406. It is noted that the interconnects 106 and connectors 406 may together be referred to as antenna connectors. In some embodiments, connectors 406 may be copper stud bumps or copper pillars (e.g., tall or short pillars, depending on the implementation). The RF die 102 may implement a transmitter, a receiver, or both. The RF die 102 may control the communication mode of each antenna 104 as a set (e.g., all antennas are controlled in a transmitting mode or all antennas are controlled in a receiving mode) or individually (e.g., one or more antennas in a subset of antennas are controlled in a transmitting mode, while one or more antennas in a different subset of antennas are controlled in a receiving mode).

PCB 402 is shown without the intervening dielectric layers for simplicity's sake. In some embodiments, each antenna 104 may be aligned with a reflector 404 in the PCB 402 configured to reflect an RF signal to the antenna 104 for improved resonance of the antenna 104. Reflector 404 has a greater thickness than antenna 104. Although not shown, a ground plane may also be implemented below the antennas 104 in the PCB or grounding elements may be implemented between each reflector 404 in the PCB. A PCB includes electrically conductive features (such as landing pads or other interconnect structures) on a non-conductive substrate formed by dielectric layers or laminates. A PCB may be a flexible type PCB using polyimide or a rigid type PCB using FR4 or BT resin, or a combination thereof.

FIG. 5A shows a bottom-up view of a packaged semiconductor device 500 implements an RF cell 100 like that shown in FIG. 1 having components similar to those shown in FIG. 4A before being attached to a PCB 402. FIGS. 5B and 5C show cross-sectional views of the device 500 when attached to PCB 402. Device 500 includes RF die 102 embedded in a panel body 518, with the active side 204 of the RF die 102 "facing up" in the bottom up view of FIG. 5A and "facing down" in the cross-section views of FIGS. 5B and 5C.

As shown in FIG. 5A, solder balls or bumps 512 are attached to signal pads on the active side 204 of the RF die 102, where solder balls 512 may provide external connections for any of ground, power supply, RF signal, and non-RF signal lines. Solder balls 512 may also be attached to landing pads 408 on the PCB 402, as shown in FIGS. 5B and 5C. Connectors 406 are attached to antenna pads on the active side of the RF die 102. Connectors 406 are further connected to interconnects 106 that extend away from the RF die 102 and are connected to respective antennas 104. As shown in FIG. 5C, PCB 402 may also include a number of reflectors 404 on a bottom side of the PCB 402, where the reflectors 404 are aligned to antennas 104. In other embodiments, reflectors 404 may be internal to PCB 402 or additional grounding features may be placed between the reflectors 404.

In the embodiment shown, antennas 104 are implemented as rod shaped antennas, although other shaped antennas (e.g., those shown in FIG. 4B and the like) may be implemented in other embodiments. Antennas 104 may be formed over a portion of panel body 518, outside of the perimeter of the RF die 102. The panel body 518 may be formed from mold compound material, as further discussed below. As shown in FIGS. 5B and 5C, the RF die 102 is surrounded on its lateral sides (or laterally surrounded) by panel body 518, while the back side of the RF die 102 is exposed. This arrangement allows a cooling system, such as a heat pipe or other thermal transfer mechanism, to be attached to the RF die 102 for improved heat transfer, as further discussed below in connection with FIG. 13-16. The solder balls 512 and edges of the antennas 104 are laterally surrounded by a mold compound layer 510.

A cavity or space 516 is hollowed out around the antennas 104 to expose the antennas 104 to free space (e.g., the ambient environment) for improved RF performance. In some embodiments, a portion of cavity 516 may optionally extend around interconnects 106 and connectors 406, as further discussed below. In the embodiment shown, cavity 516 includes an air gap under the antennas 104 (e.g., between the antennas 104 and the PCB 402), an air gap over the antennas 104 (e.g., between the antennas 104 and the RF die 102), and an air gap next to the antennas 104 (e.g., laterally between the antennas and the panel body 518). In other embodiments, cavities 516 may include fewer air gaps than these (e.g., see FIG. 10K for an air gap that only exposes an outer surface of antennas 104 that faces the PCB 402). Cavities 516 may be formed by laser removal of a dielectric layer, removal of a sacrificial dielectric layer, or both, as further discussed below in connection with the fabrication processes of such a packaged semiconductor device. In some embodiments, a dielectric material 514 is formed near the outer end of antenna 104 as a structural support to secure the antenna 104 to the panel body 518 while forming a spacer for cavity 516 to be formed above the inner surface of antenna 104 (e.g., between the antenna 104 and the active side of the RF die 102, being opposite the outer surface), as well as below the outer surface of antenna 104 (e.g., between the antenna 104 and the top side of the PCB 402). In some embodiments, a portion of the panel body 518 may remain over edges of outer ends of the antennas 104 near dielectric material 514 for reinforced structural support (e.g., like that shown in FIG. 5C).

Returning to FIG. 1, the RF cell 100 has a footprint or outer perimeter (shown in dashed lines) having a row length 114 and a column length 116. The footprint of the RF cell 100 is large enough to include the layout of the set of antennas 104 and a portion of the row pitch 110 and column pitch 112, such that the RF cell 100 can be used as a template and repeated (e.g., placed side-to-side in both row and column directions) to form an array of RF cells 100 (also referred to as an RF cell layout) in which the RF dies 102 are arranged with a uniform row pitch and a uniform column pitch (where the uniform row pitch may or may not be equal to the uniform column pitch). The layout of the set of antennas 104 within the RF cell's footprint can also be repeated in a same manner to form an array of antennas in which antennas are arranged with a uniform row pitch and a uniform column pitch (where the uniform row pitch may or may not be equal to the uniform column pitch). The present disclosure provides a manner of forming a single packaged semiconductor device that includes an array of RF dies 102 and a corresponding array of antennas 104 arranged according to an RF cell layout, as further discussed below.

Figure 6B:
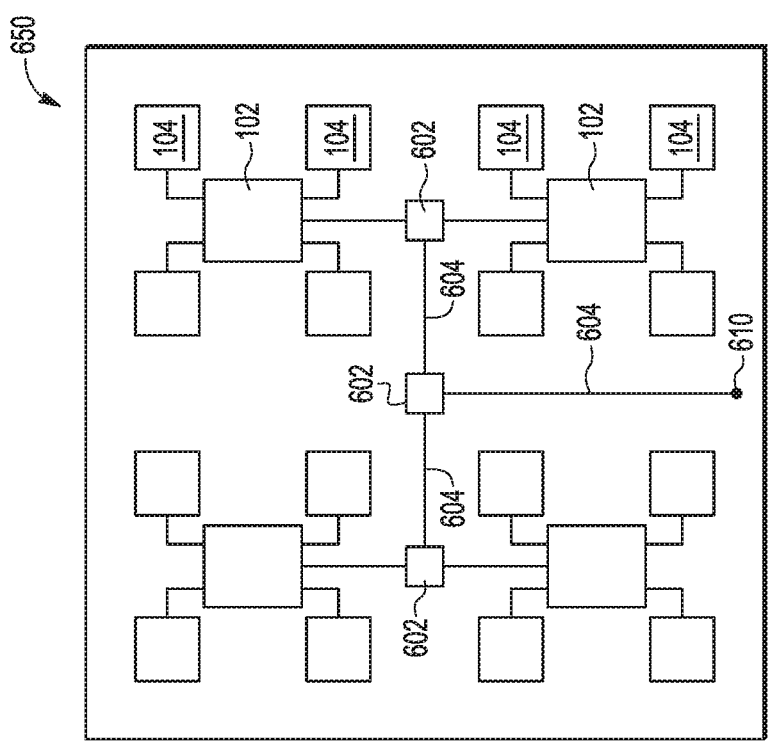
FIGS. 6A, 6B, 7, and 8 are block diagrams depicting example arrays of RF cells according to some embodiments of the present disclosure.
Figure 6A:
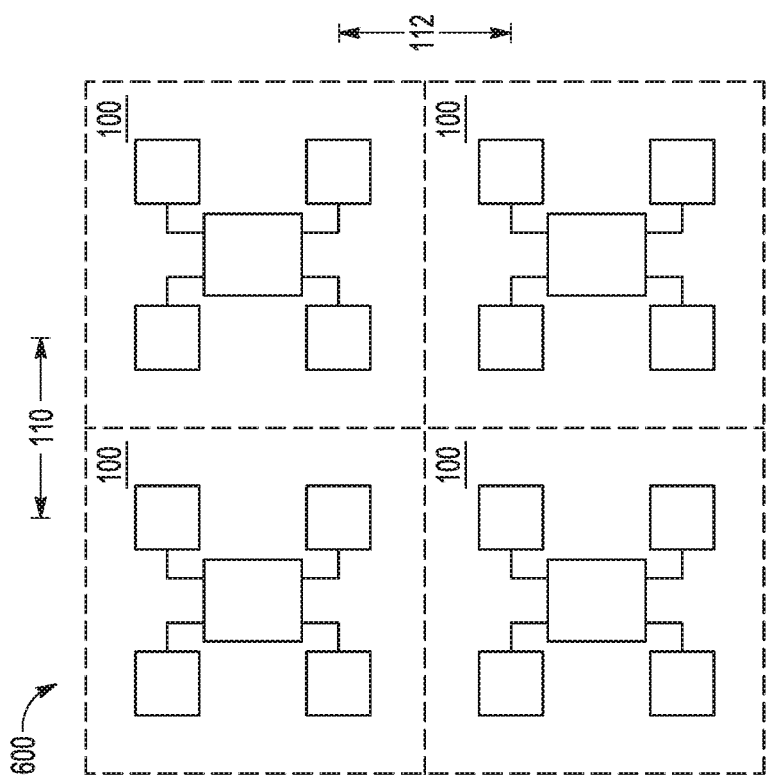
Figure 17:
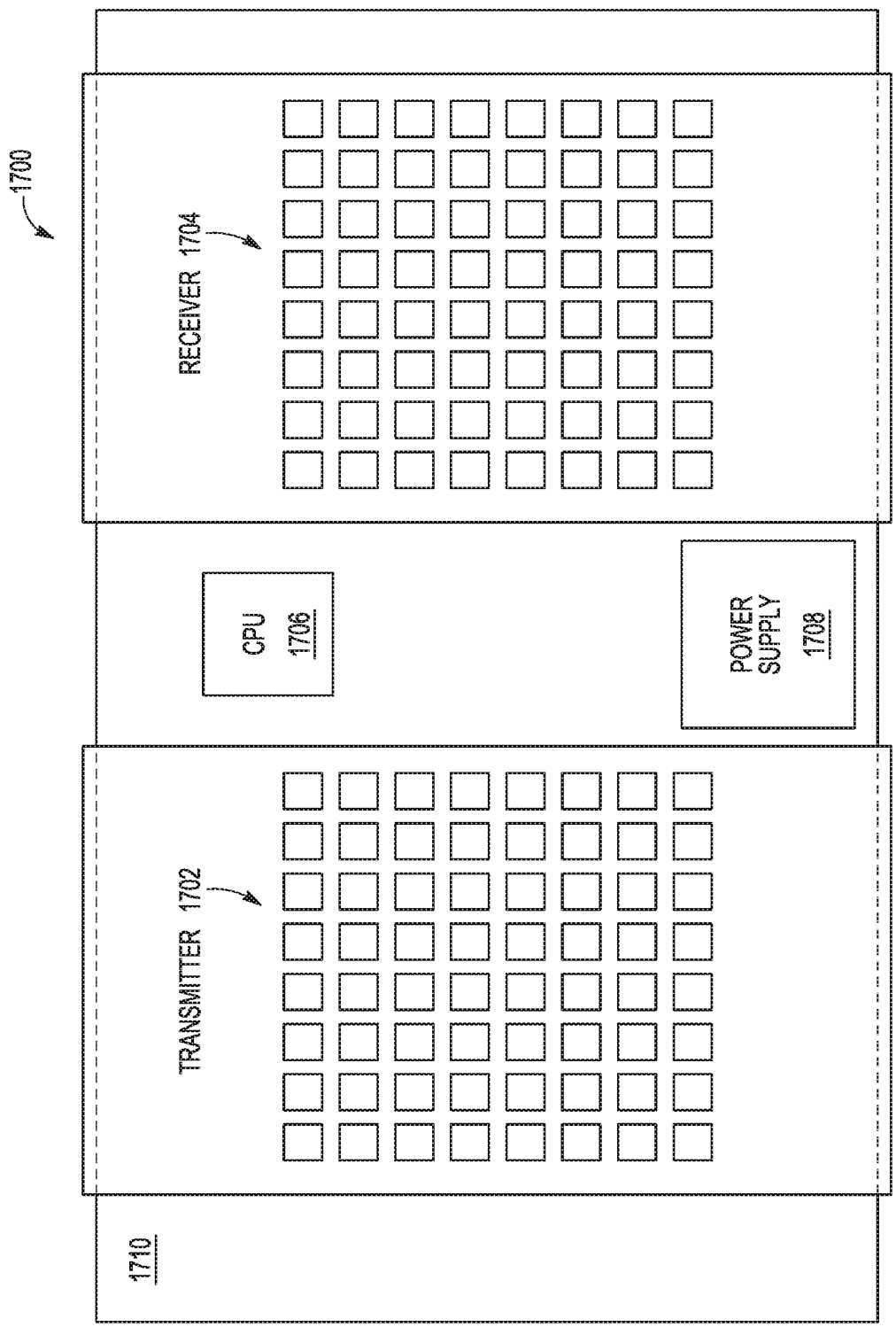
FIG. 17 is a block diagram depicting an example packaged semiconductor device attached to a PCB, according to some embodiments of the present disclosure.

It is noted that any number of RF cells 100 may be implemented in such an array, such as a simple 2×2 (e.g., N×M) arrangement of RF cells 100 shown in FIG. 6A. The arrangement of RF cells may be in a variety of shapes, such as rectangular, a circular arrangement (e.g., where the RF dies may or may not be in N rows and M columns), an amorphous shape (e.g., an N×M number of RF dies but not arranged in rows and columns), and the like. The RF cell layout 600 implements an RF cell array that includes a total of 4 RF dies 102, which are configured to be coupled to a total of 16 antennas 104. Other examples include a 4×8 RF cell array (e.g., 32 RF dies coupled to 128 antennas), an 8×8 RF cell array (e.g., 64 RF dies coupled to 256 antennas), and beyond. In some embodiments, one instance of an RF cell layout may be used to implement an array of RF dies and corresponding array of antennas as part of a transmitter, also referred to as a transmitter array, while another instance array of the RF cell layout may be used to implement another array of RF dies and corresponding array of antennas as part of a receiver, also referred to as a receiver array. For example, FIG. 17 shows a transmitter array 1702 and a receiver array 1704 that are each implemented based on an N×M cell array, N being an integer greater than one and M being another integer greater than one, where N and M need not be equal. In some embodiments, the transmitter array 1702 may be implemented in one packaged semiconductor device (e.g., 8×8 RF cells, equal to 64 RF dies and 256 antennas) and the receiver array 1704 may be implemented in another packaged semiconductor device (e.g., 8×8 RF cells, equal to 64 RF dies and 256 antennas). In other embodiments, a single packaged semiconductor device may include both the transmitter array 1702 and the receiver array 1704 (e.g., 2×8×8 RF cells, equal to 128 RF dies and 512 antennas).

The one or more packaged semiconductor devices may be used to form a larger packaged device, such as a router or other network device that provides wireless communication. For example, FIG. 17 shows a device 1700 that includes the transmitter array 1702 and the receiver array 1704 (either as a single packaged semiconductor device or as two packaged semiconductor devices) attached to a PCB 1710. A central processing unit (CPU) 1706 may also be attached to the PCB 1710, which may be configured to perform signal processing, such as digital signal processing to extract information from received RF signals or generate an RF signal that includes information for transmission. A power supply 1708 may also be attached to the PCB 1710 to power the CPU, the RF dies, and other various device components.

FIG. 6B shows an example array 650 of RF dies 102 arranged in a two row, two column (2×2) array according to the RF cell layout 600 shown in FIG. 6A. Array 650 also includes a corresponding array of antennas 104, with a corresponding set of antennas 104 coupled to each RF die 102. A branching RF signal path tree to propagate an RF signal is also shown, implemented as RF signal lines 604 coupled to each of the RF dies 102 using a number of splitter dies 602 at each branching point of the tree. Splitter dies 602 may also be referred to herein as branching dies 602 or RF branching dies 602. Each splitter die 602 includes active circuitry that implements a power splitter, power combiner, or both, and has low insertion loss. For example, each splitter die 602 may implement a Wilkinson power divider circuit (e.g., see FIG. 18), a resistive splitter circuit, a branch line coupler circuit, a large coupler circuit, a hybrid coupler circuit (e.g., a rat race coupler circuit), or similar circuit structure, which may be used as either a power splitter or a power combiner (e.g., the direction of the RF signal propagation changes based on a transmit or receive mode of the device). In other embodiments, each splitter die 602 may implement a dedicated power splitter (e.g., for a dedicated transmitter device 1702 like that shown in FIG. 17) or a dedicated power combiner (e.g., for a dedicated receiver device 1704 like that shown in FIG. 17).

Each splitter die 602 has 3 ports, one "upstream" port that faces a device master port 610 and two "downstream" ports that face the RF dies 102. The splitter dies, which may be considered to implement branches of the tree, split the RF signal a number of times to reach an RF signal pad on the RF dies, which may be considered as leaf nodes on the tree. A splitter die 602 that implements (or is controlled to implement) a power splitter is configured to split an input RF signal present on the upstream port into comparable output RF signals that is output at the two downstream ports. A splitter die 602 that implements (or is controlled to implement) a power combiner is configured to combine two input RF signals from the downstream ports into a single RF signal that is output on the upstream port toward the master port 610. Splitter dies 602 may be formed using WLCSP (wafer level chip scale package) technology. The number of splitter dies 602 implemented between RF dies 102 depends on the number of branching points in the RF signal path tree, which may be comparable to the number of RF dies 102 implemented in the layout (e.g., 3 splitter dies implemented for the RF signal path tree to reach 4 RF dies). The RF signal path tree, including the splitter dies 602, are arranged along the boundaries of the RF cells 100 in order to minimize the distance (or minimize the length of signal lines 604) between each of the RF dies 102 and the splitter dies 602.

For example, when transmitting an RF signal (such as in a dedicated transmitter or in a transceiver set to a transmit mode), the RF signal starts from master port 610 on a "trunk" path of the tree and is routed through signal lines 604 and splitter dies 602 to reach each RF die as "leaves" on the tree. The RF signal enters a first splitter die 602 shown in the middle of FIG. 6B, which outputs the RF signal onto a pair of branches (implemented by signal lines 604), one to the left and one to the right. The left branch is split into another pair of branches by another splitter die 602 closest to a pair of left RF dies (shown to the left of FIG. 6B). This splitter die 602 may be referred to as a neighboring splitter die 602, which has downstream ports respectively connected to an RF signal pad of the top left RF die and an RF signal pad of the bottom left RF die. The RF signal received on the RF signal pads is transmitted by front-end circuitry of the pair of left RF die on their respective set of antennas 104. The right branch is also split into another pair of branches (or signal lines 604) by another splitter die 602 closest to the RF dies (shown to the right of FIG. 6B). This neighboring splitter die 602 has downstream ports that are respectively connected to an RF signal pad of the top right RF die and an RF signal pad of the bottom right RF die, each of which include front-end circuitry that also transmit the RF signal on their respective set of antennas 104. In this manner, every RF die outputs the RF signal on their respective set of antennas 104. A reverse path is followed when receiving an RF signal (such as in a dedicated receiver or in a transceiver set to a receive mode). The RF signal is received at each set of antennas 104 and is processed by front-end circuitry by each RF die, which outputs the RF signal on its respective RF signal pad to the neighboring or closest splitter die 602. The neighboring splitter dies 602 combine the RF signals, outputting the RF signals on upstream ports to other splitter dies 602 toward the master port 610, eventually combining into the trunk path of the tree toward the device master port 610. The branching pattern shown in FIG. 6B is symmetrical about the vertical and horizontal midlines of the array 650. In this manner, the branching signal path tree is beneficial for implementing MIMO (multi-input, multi-output) communications.

Figure 8:
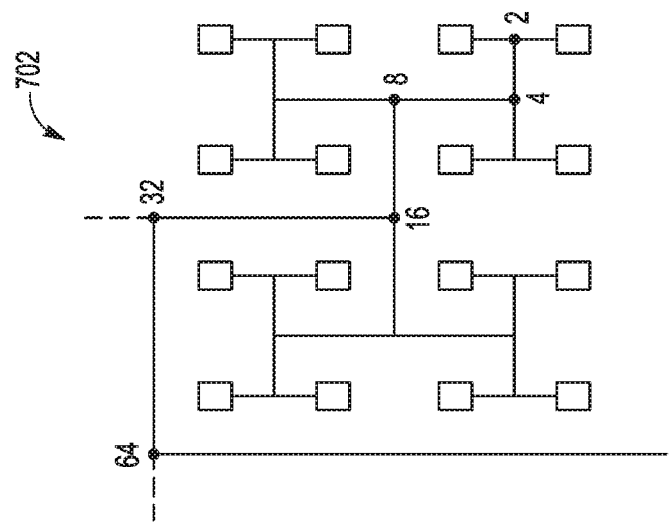
Figure 7:
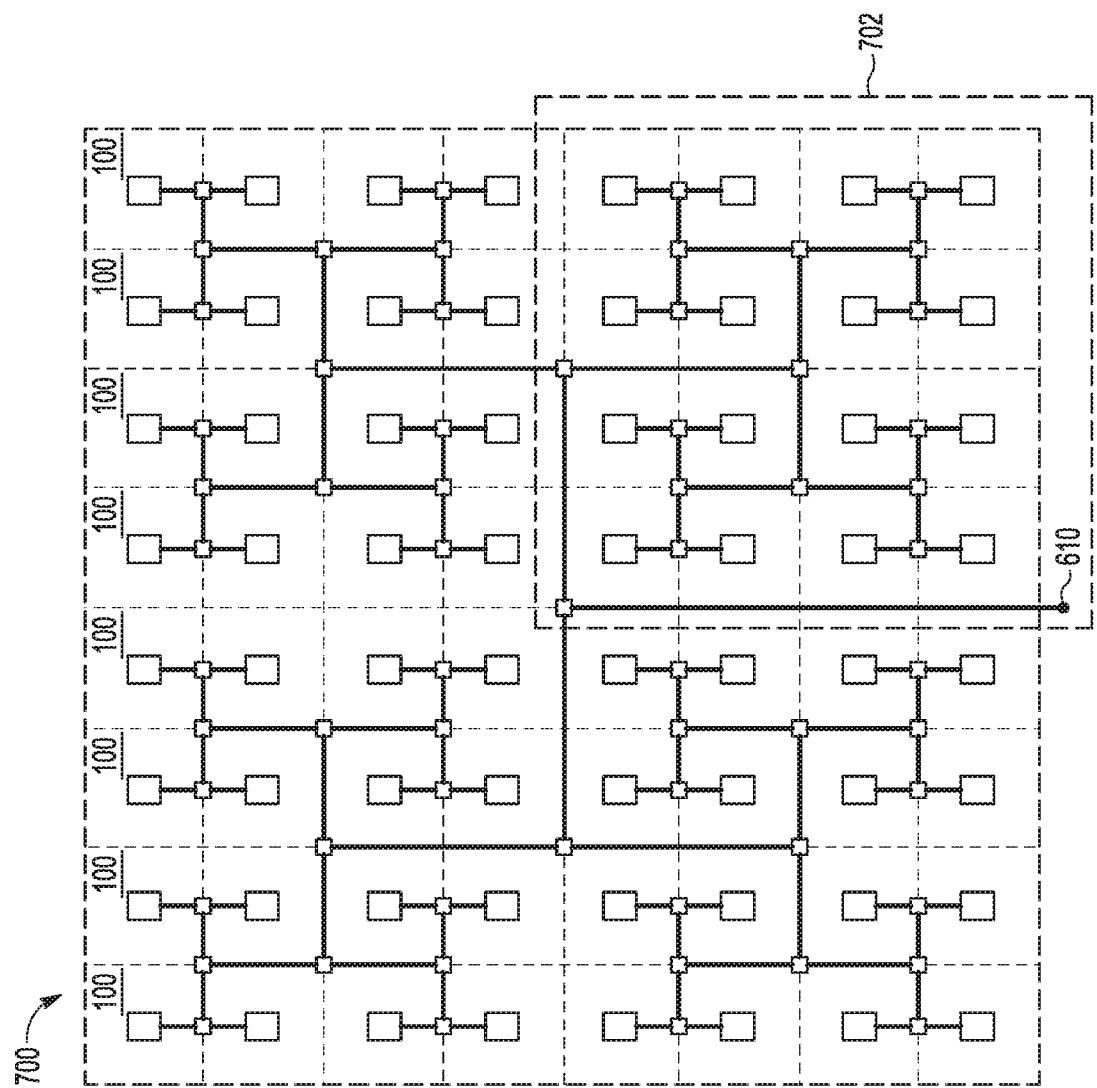

The example branching pattern shown in FIG. 6B can be used to form larger branches of the signal path tree between the device master port 610 and each of the RF dies 102 in a larger array. FIG. 7 shows an example signal path tree for an RF cell layout 700 that implements an 8×8 RF cell array, for a total of 64 RF dies, 63 splitter dies, and 256 antennas (where the antennas are not shown for simplicity's sake). The branching pattern of FIG. 6B is used to implement symmetrical portions of branches, where the overall resulting signal path tree is generally symmetrical about the vertical and horizontal midlines of the array 700 (e.g., a common branching pattern can be seen in four quadrants of the array 700), although other branching patterns may be used in other embodiments. A lower right portion 702 is shown in FIG. 8, which shows a number of RF die that are coupled to each branching point. Starting at the pair of RF dies at the lower right in FIG. 8, a first branching point is coupled to 2 dies, a next branching point toward the master port 610 is coupled to 4 dies, and a next branching point toward the master port 610 is coupled to 8 dies. Subsequent branching points are coupled to 16, 32, and 64 dies, respectively.

Figure 14:
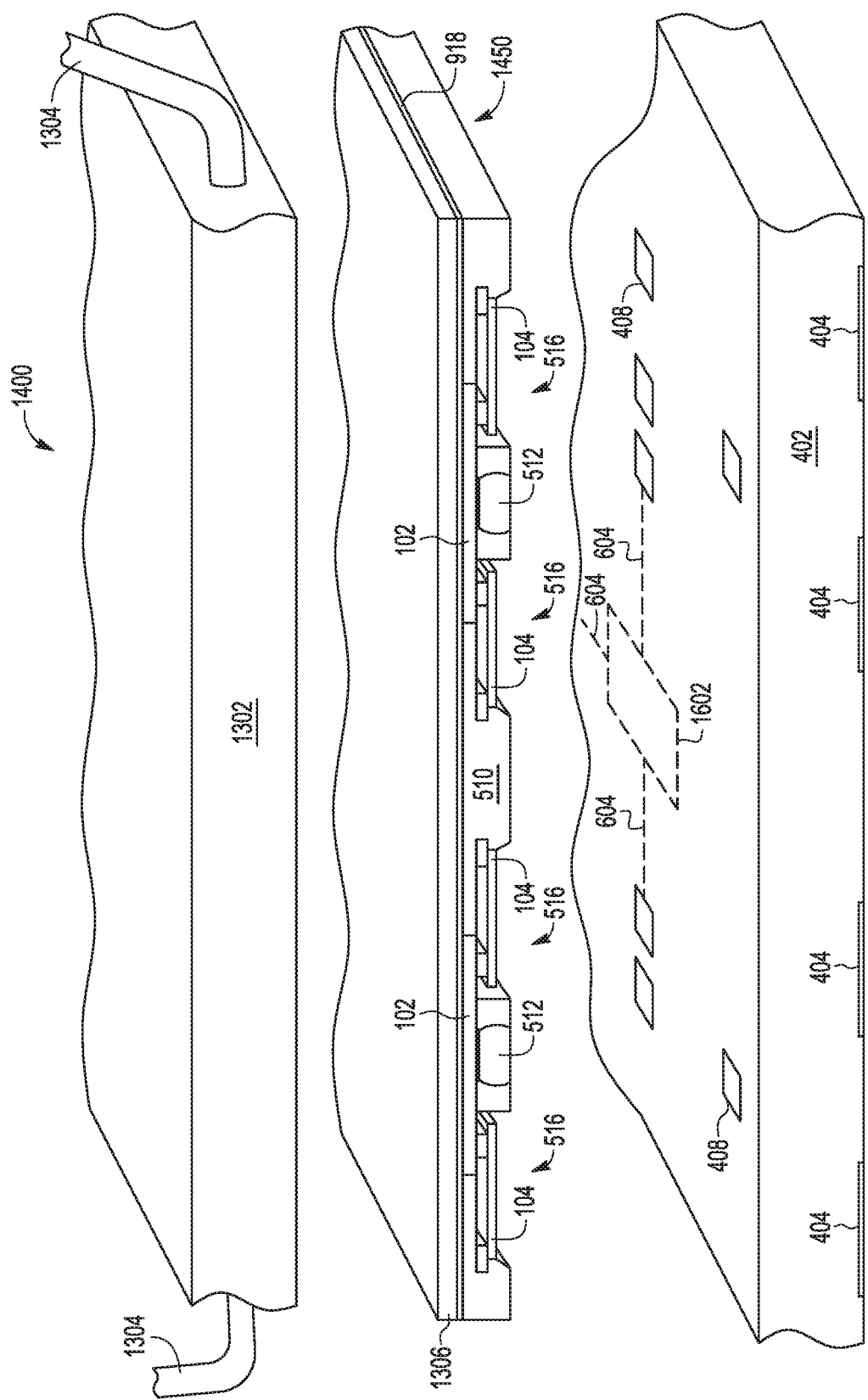
Figure 15:
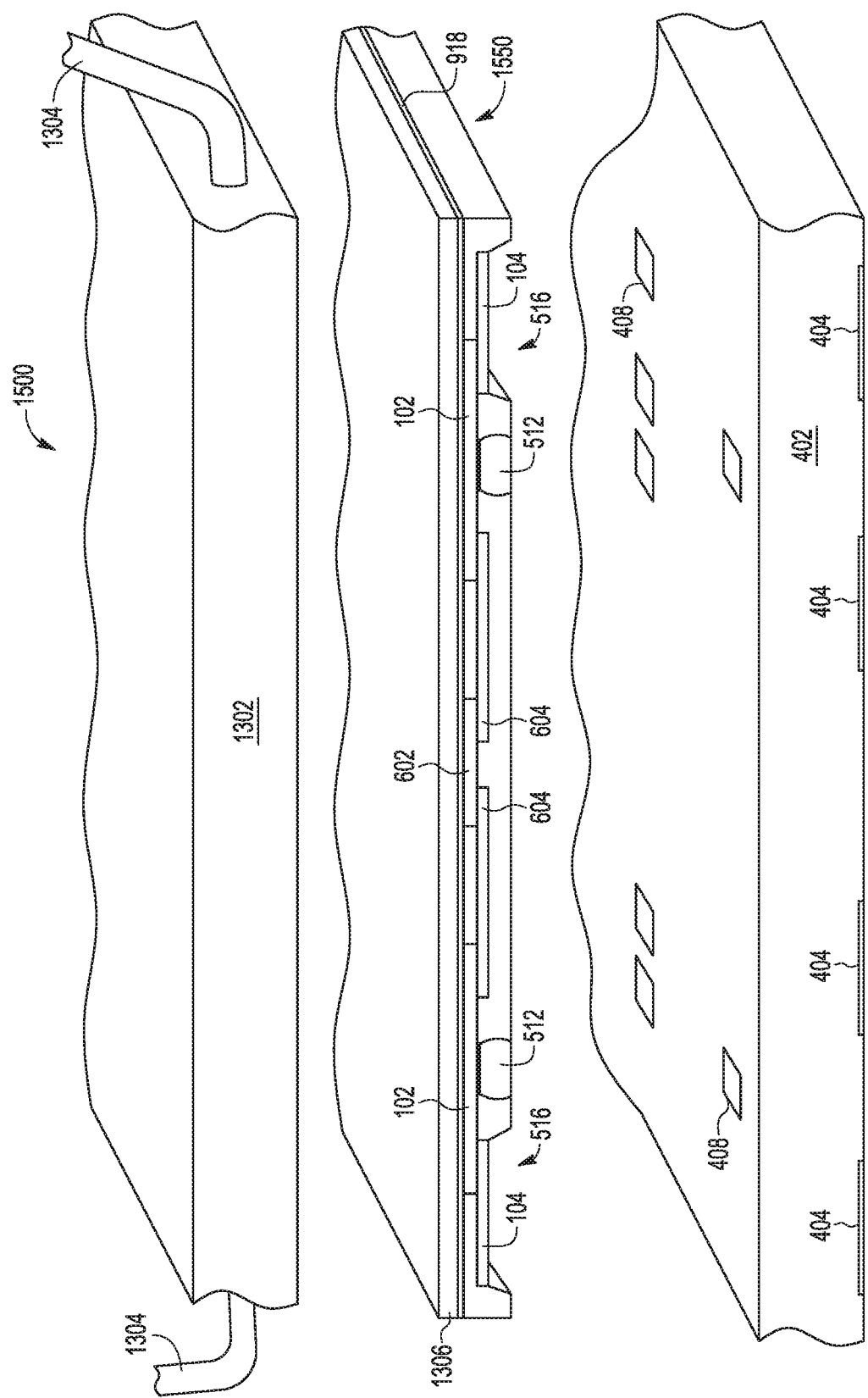
Figure 16:
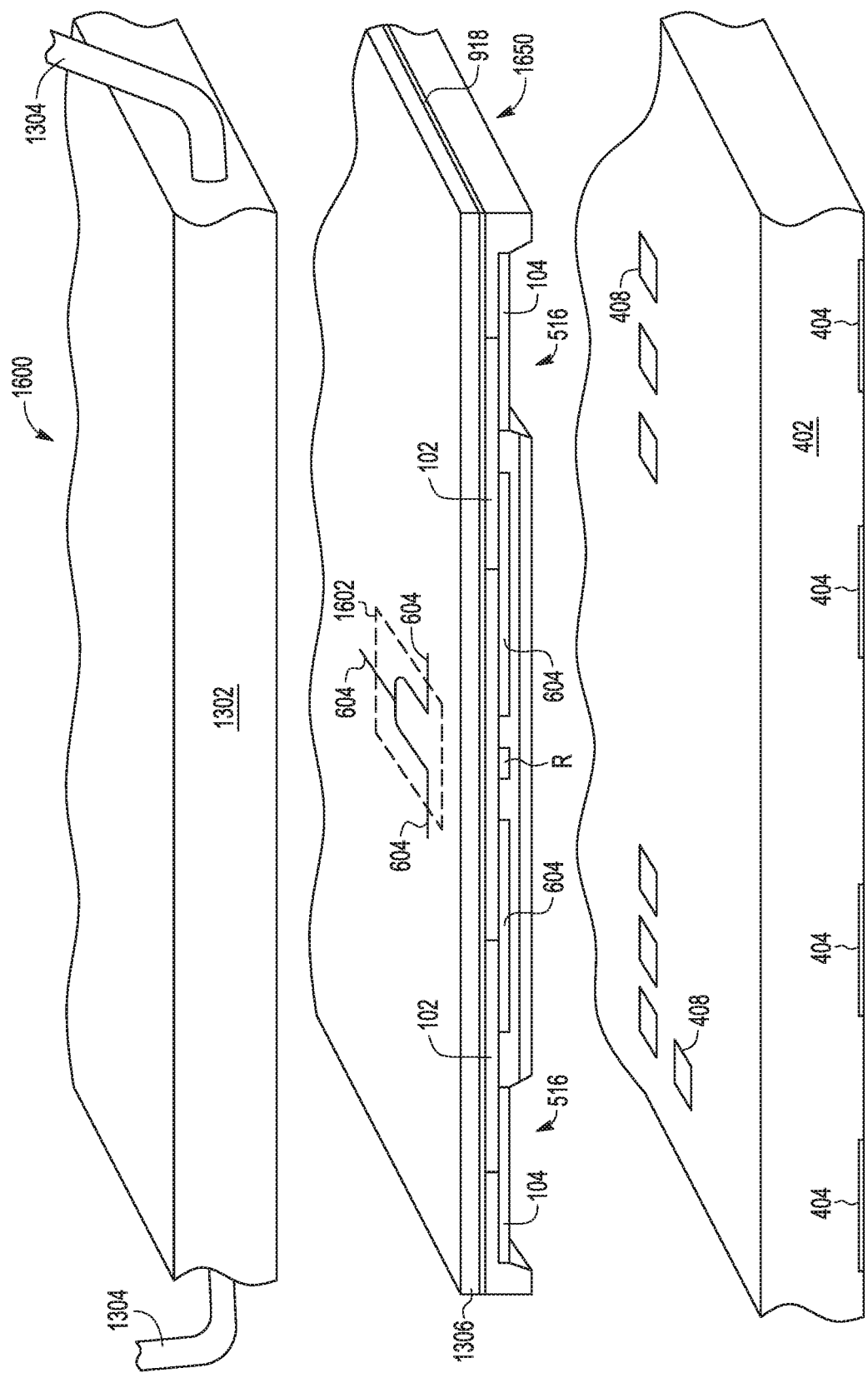

The RF signal lines 604 that implement the branching RF signal path may be implemented either in the PCB 402 or in the various embodiments of packaged semiconductor devices discussed herein. Some embodiments provide that both the signal lines 604 and the splitter dies 602 are implemented in the PCB 402, such as the embodiment shown in FIG. 14. Other embodiments provide that the splitter dies 602 are implemented in the packaged semiconductor device, as shown in FIGS. 13 and 15, while still other embodiments provide that both the signal lines 604 and the splitter dies 602 are implemented in the packaged semiconductor device, as shown in FIG. 16. The embodiments described herein may be fabricated using processes like those shown in FIGS. 9A-9E, 10A-10J, 11A-11M, and 12A-12C.

FIG. 9A-9E shows an example process flow for creating a panel that includes an array of RF dies 102, which are arranged according to a layout of RF cells 100. In some embodiments, the panel also includes an array of splitter dies 602, although inclusion of the splitter dies 602 is optional. While only two RF dies 102 and one splitter die 602 are shown in FIG. 9A-9E, these dies are representative of all RF dies 102 and splitter dies 602 included in the packaged semiconductor device.

Figure 9A:
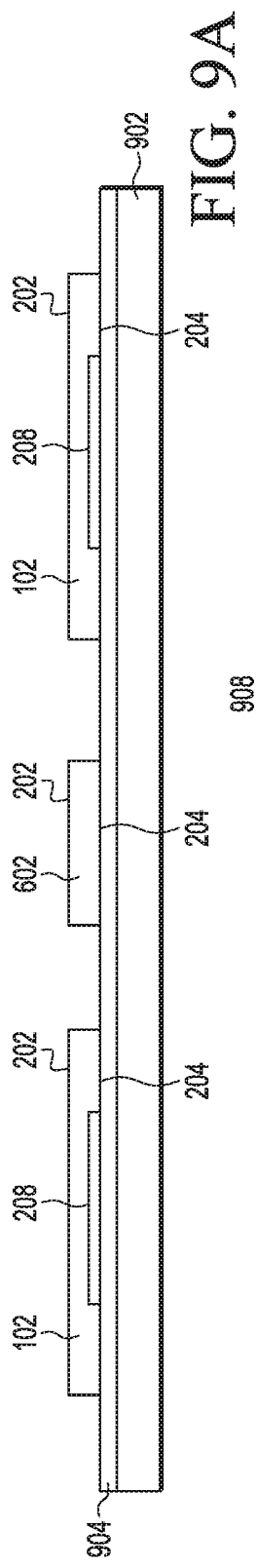
FIG. 9A-9E are block diagrams depicting an example process flow for creating a panel that includes multiple RF die, according to some embodiments of the present disclosure.

FIG. 9A shows a number of RF dies 102 and a number of splitter dies 602 placed on a temporary carrier such as a tape 902 with adhesive 904 according to an RF cell array. In some embodiments, a tape (like tape 902) is formed from a polymer film such as PVC (polyvinyl chloride), polyolefin, polyethylene, or similar material, where an adhesive (like adhesive 904) such as a pressure sensitive adhesive is placed on a surface of the polymer film. Examples of adhesive 904 include but are not limited to elastomers, acrylate polymers, natural or synthetic rubbers, silicone rubber, and the like. In some embodiments, tape 902 is removable in response to UV (ultraviolet light) exposure or elevated temperature exposure (e.g., the adhesive 904 weakens in response to the UV exposure or temperature excursion), solvents, and the like. In some embodiments, tape 902 includes a release layer to release the panel from the tape 902. In some embodiments, tape 902 may be replaced with a temporary carrier 902, such as a glass carrier or other removable carrier.

The RF dies 102 and splitter dies 602 are placed in locations on the tape 902 that correspond to the RF cell array layout, which also correspond to locations on the PCB. The RF dies 102 and the splitter dies 602 each have an active side 204 that include signal pads. The RF dies 102 and splitter dies 602 are placed in active side 204 down (or face down) orientation on the tape adhesive 904. RF dies 102 each have an RF-sensitive area 208 on the active side 204, which may include front-end circuitry that implements a transmitter, a receiver, or both. The RF dies 102 and splitter dies 602 each have a back side 202 that faces away from the tape 902.

Figure 9B:
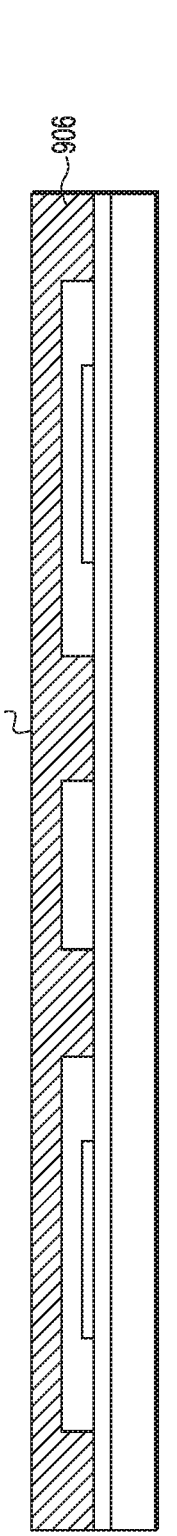

FIG. 9B shows the RF dies 102 and splitter dies 602 after they are encapsulated on the tape 902. The RF dies 102 and splitter dies 602 are encapsulated with a mold compound material to form a mold body 906 having a back surface 908 over the back sides 202 of each of the dies 102 and 602 (where the encapsulated dies 102 and 602 are also referred to herein as an array of embedded dies). In some embodiments, the mold compound material may be based on a biphenyl type or multi-aromatic type epoxy resin, organic materials such as plastics that include elastomers, siloxanes, epoxides, acrylates, polyurethane, silicone resin, polystyrene, polycarbonate, or other appropriate material. Mold compound material may include a low CTE (coefficient of thermal expansion) filler (e.g., silica, alumina, boron nitride, and the like) in a liquid polymer that can be cured or set (e.g., by heat, ultraviolet light, and the like) into a solid composite material. The encapsulation may be performed by transfer molding techniques, overmolding techniques, glob top, potting, compression molding techniques, or other suitable encapsulation techniques.

It is also noted that the pitch between the RF dies (such as the column pitch and row pitch) are adjusted to offset any known shrinkage of the mold body 906 to maintain the proper distance between the RF dies 102. For example, a panel of a certain size may experience shrinkage of the mold body (e.g., as the mold compound sets, the overall mold body may shrink). The column and row pitches of the RF dies may be increased by the known shrinkage of the mold body to compensate for such shrinkage (e.g., if the mold body shrinks by 1 to 2%, then the distance between the RF dies is increased by 1 to 2%).

Figure 9C:
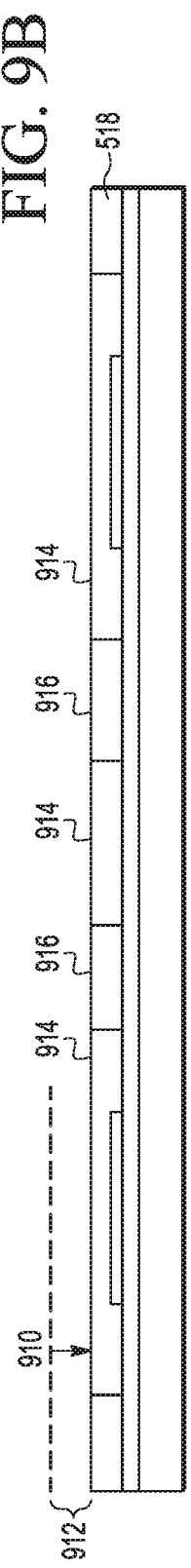

FIG. 9C shows the panel of embedded dies after a planarization step 910 is performed to reduce the thickness of the panel and form a new back side of the panel. The planarization step 910 removes a portion 912 of the mold body 906 to expose a (new) back surface 916 of a resulting panel body 518 (e.g., like that shown in FIGS. 5B and 5C), which is also referred to as a back side 916 of the panel of embedded dies. The planarization step 910 also removes a portion of each of the dies 102 and 602 to expose a (new) back side 914 of each die in the back side 916 of the panel. The planarization step 910 may also be followed by a polishing step, such as using dry polish, ultra fine grinding, or other suitable technique. The planarization step 910 may be performed using a grinding or CMP (chemical mechanical polishing) technique to achieve coplanar surfaces 914 and 916.

Figure 9D:
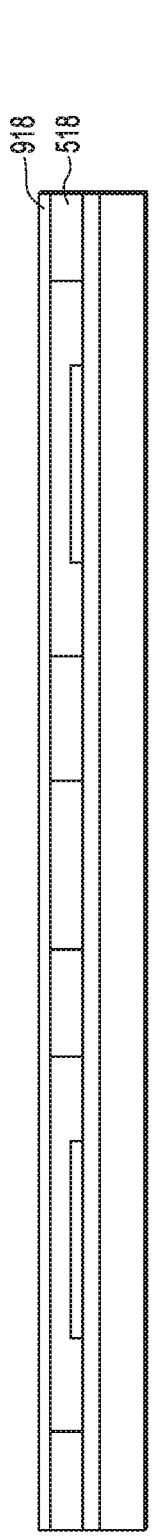

FIG. 9D shows the panel of embedded dies after an optional back side metallization layer 918 is formed over coplanar surfaces 914 and 916. Without the metallization layer 918, the planarization step 910 reduces the thickness of dies 102 and 602 and provides coplanar back sides of the dies 102 and 602 (e.g., eliminates any tilting of the back sides of dies 102 and 602), both of which improve thermal performance of the panel of embedded dies. In the embodiment shown, the metallization layer 918 directly contacts the silicon back side of each of the RF dies 102 and splitter dies 602 for improved thermal conductivity and further improved thermal performance of the panel. Thermal performance is further discussed below in connection with FIG. 13-16. A metallization layer (like metallization layer 918) is formed by a deposition process including but not limited to sputtering, spin coating, chemical vapor deposition (CVD), physical vapor deposition (PVD), and conformal deposition. A metallization layer (like metallization layer 918) may include one or more conductive materials, such as gold, copper, aluminum, tungsten, and the like, having suitable thermal conductive properties.

Figure 9E:

FIG. 9E shows the panel of embedded dies after another temporary carrier 920 (like temporary carrier 902) is attached to the back side of the panel of embedded dies with adhesive 922 (like adhesive 904), and the panel is flipped. Tape 902 and adhesive 904 are also removed from the front side of the panel to expose the front side 924 of the panel body 518 and the active sides 204 of the dies 102 and 602, where front side 924 and active sides 204 are coplanar. It is noted that the optional back side metallization layer 918 is not included in the embodiment shown in FIG. 9E. In other embodiments that include metallization layer 918, the carrier 920 would be attached to metallization layer 918 on the back side of the panel with adhesive 922. The panel shown in FIG. 9E is positioned in an active side 204 up (or face up) orientation. The panel shown in FIG. 9E may be used to begin the fabrication process shown in FIG. 10A.

FIG. 10A-10L shows an example process flow for creating a packaged semiconductor device that includes both a panel of multiple RF dies and an array of antennas, which are arranged according to a layout of RF cells. In some embodiments, the panel of embedded dies may include both RF dies and splitter dies (like the panel of embedded dies shown in FIG. 9E), while in other embodiments the panel of embedded die may include only RF dies (similar to the panel of embedded dies shown in FIG. 9E without the splitter dies 602). While only one RF die 102 is shown in detail for simplicity's sake, this RF die 102 is representative of all RF dies 102 and the process described herein is applicable to all RF dies 102 of the panel. The process described in connection with the signal pads on the RF dies 102 may also applicable to any of the pads of the splitter dies 602 that may be optionally included in the panel of embedded dies (like that panel shown in FIG. 9E). Also, the carrier 920 and adhesive 922 (as shown in FIG. 9E) are omitted from the following figures for simplicity's sake.

Figure 10A:
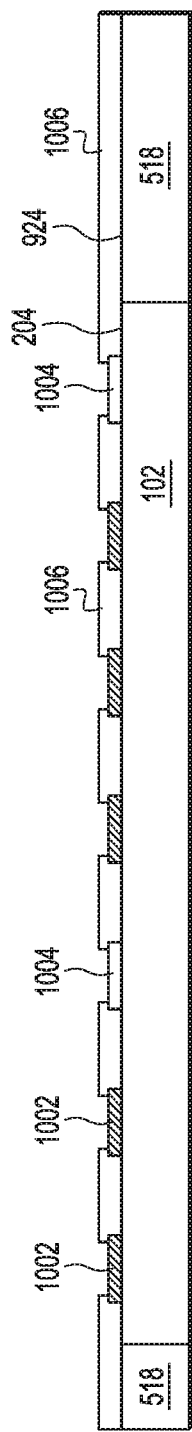

FIG. 10A shows a panel of embedded dies that includes an RF die 102 in a face up (active side 204 up) orientation with a panel body 518 (similar to that shown in FIG. 9C) surrounding the lateral edges of the RF die 102. It is noted that the dimensions of the components shown in the figures are not necessarily drawn to scale. The active side 204 of RF die 102 and the front side 924 (also shown in FIG. 9E) of the panel body 518 are also cumulatively referred to as the front side of the panel of embedded die, which is shown as the top surface in the following figures. The back side 914 of RF die 102 and the back side 916 of the panel body 518 are also cumulatively referred to as the back side of the panel of embedded die, which is shown as the bottom surface in the following figures.

Figure 13:
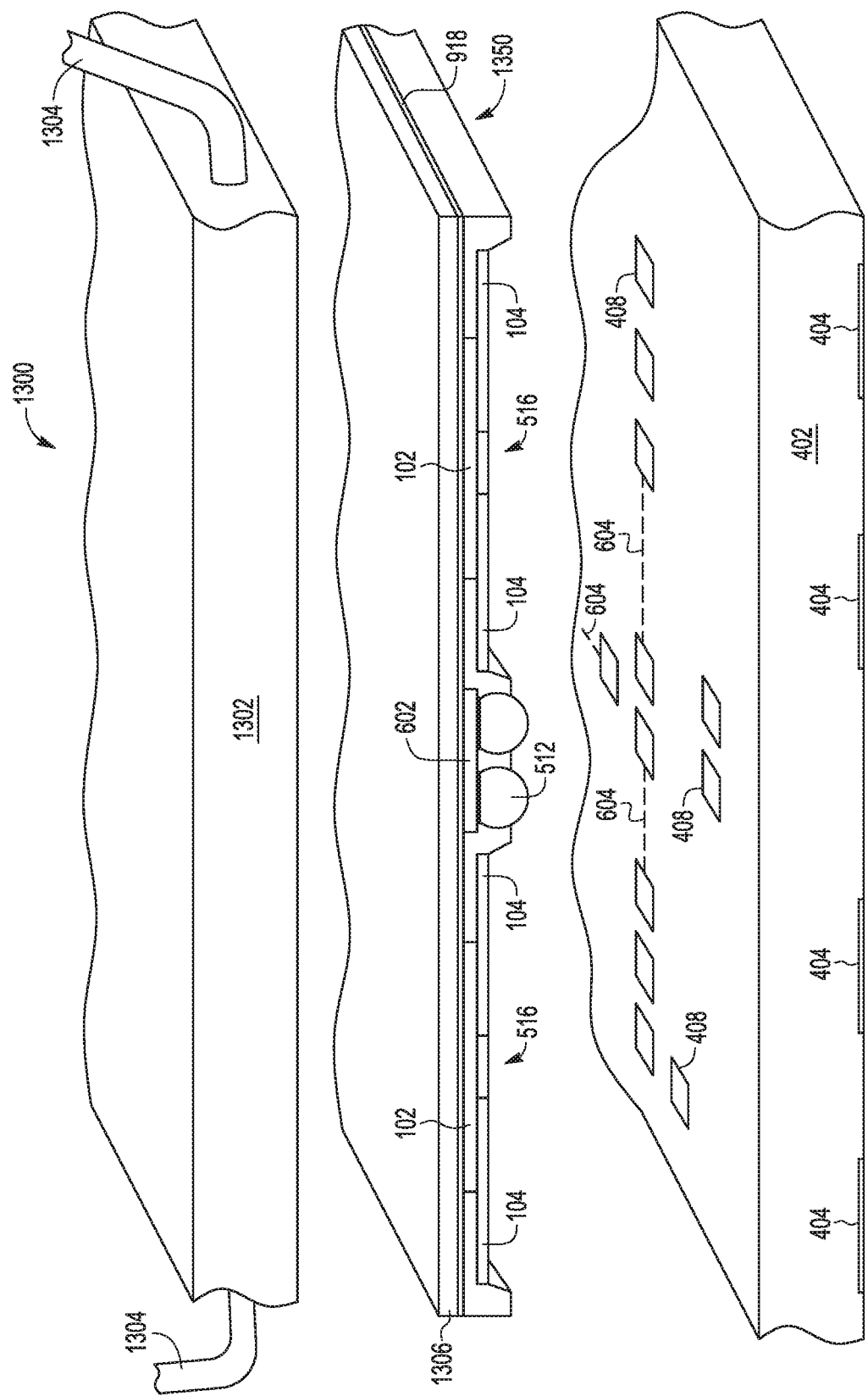
FIG. 13-16 are block diagrams depicting interfaces between example packaged semiconductor devices and a printed circuit board (PCB), according to some embodiments of the present disclosure.

RF die 102 includes a plurality of signal pads 1002 and a plurality of antenna pads 1004 on the active side 204 of the RF die 102. Antenna pads 1004 are configured to be coupled to a set of antennas (e.g., for receiving, transmitting, or both) that will be formed on the panel of embedded die, as discussed below. The antenna pads 1004 are connected to active circuitry of the RF die 102, which may include front-end circuitry such as a transmitter circuit, a receiver circuit, or both as a transceiver circuit (e.g., discussed above as active circuitry in RF-sensitive area 208). For example, antenna pads 1004 may connect the antennas to a front-end input line (e.g., for receiver processing) or a front-end output line (e.g., for transmission on the antennas). Signal pads 1002 are also connected to active circuitry of the RF die 102 and provide external connections for ground lines, power supply lines, or other signal lines (e.g., RF or non-RF signal lines) of the active circuitry. Signal pads 1002 are configured to be coupled to landing pads on a PCB that provide ground lines, power supply lines, or other signal lines (e.g., RF or non-RF signal lines). In some embodiments, signal pads 1002 may also provide an external connection for a dedicated RF signal line (also referred to as an RF signal pad), which may be used to carry an RF signal between the RF die 102 and the PCB (e.g., when signal lines 604 are located on the PCB as shown in FIGS. 13 and 14) or between the RF die 102 and a neighboring splitter die 602 (e.g., when signal lines 604 are located in an RDL structure as shown in FIGS. 15 and 16).

In the embodiment shown, a passivation layer 1006 covers the active side 204 of the RF die 102 and the front side 924 of the panel body 518, with openings in the layer 1006 to expose bonding surfaces of the signal pads 1002 and antenna pads 1004 (also shown as the top surfaces of pads 1002 and 1004 in FIG. 10A). Passivation layer 1006 may also similarly cover the active side of a splitter die 602, if present, with similar openings for pads on the splitter die 602. Examples of materials used for passivation layer 1006 include but are not limited to silicon nitride, silicon dioxide, silicon oxynitride, polyimide, and other suitable dielectric materials.

In some embodiments, passivation layer 1006 may be formed as part of a redistribution layer (RDL) structure formed on the front side of the panel of embedded dies, where passivation layer 1006 may be formed from a polymer dielectric material. Examples of polymer dielectric materials include but are not limited to polybenzoxazole (PBO), benzocyclobutene (BCB), polyimide, photo sensitive polyimide, and other suitable polymer dielectric materials. An RDL structure is formed using a sequence of numerous process steps applied to the panel of embedded die, including but not limited to depositing semiconductor materials including dielectric materials and metals, such as growing, oxidizing, sputtering, and conformal depositing, etching semiconductor materials, such as using a wet etchant or a dry etchant, performing photolithography for patterning, including depositing and removing photolithography masks or other photoresist materials, laminating, dispensing, printing, jetting, spraying, and the like.

Figure 10B:
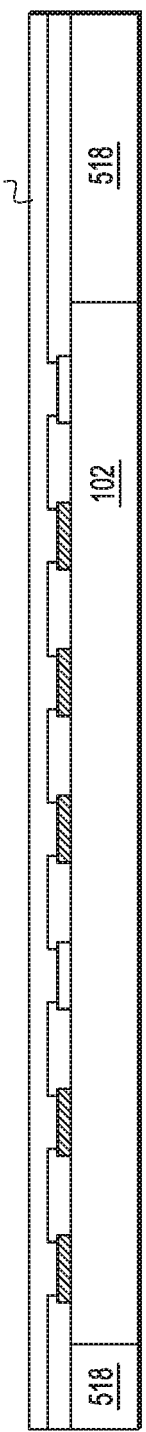
Figure 10C:
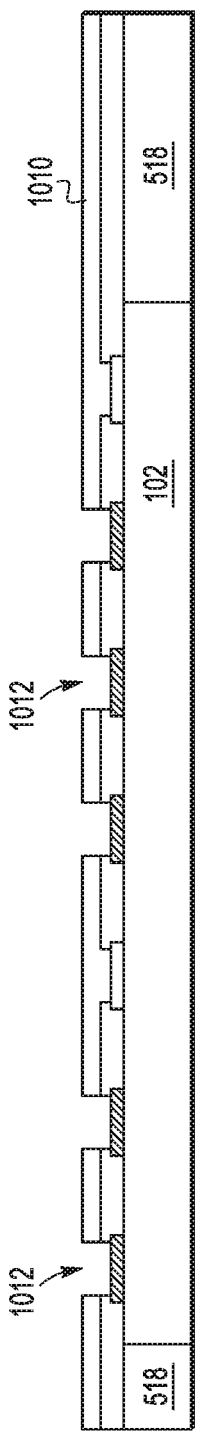

FIG. 10B shows the panel of embedded dies after a dielectric layer 1010 is deposited over the active side 204 of the RF die 102 and front side 924 of mold body (and active side 204 of the splitter die 602, if present). Dielectric layer 1010 may be formed from a polymer dielectric material (discussed above) and may be conformally deposited over and directly contacting the passivation layer 1006, as well as within each opening of the signal pads 1002 and antenna pads 1004.

FIG. 10O shows the panel of embedded dies after a number of openings 1012 have been formed in dielectric layer 1010 that expose bonding surfaces of signal pads 1002. Additional steps for forming openings in a dielectric layer (like the openings 1012 in dielectric layer 1010) may include depositing and patterning a photoresist material (e.g., silicon nitride or silicon dioxide) over the dielectric layer on the front side of the panel of embedded dies, performing an etching process to remove portions of the dielectric layer to expose the bonding surfaces of signal pads 1002, and removing the remaining photoresist material. The antenna pads 1004 remain covered by the dielectric layer 1010.

Figure 10D:
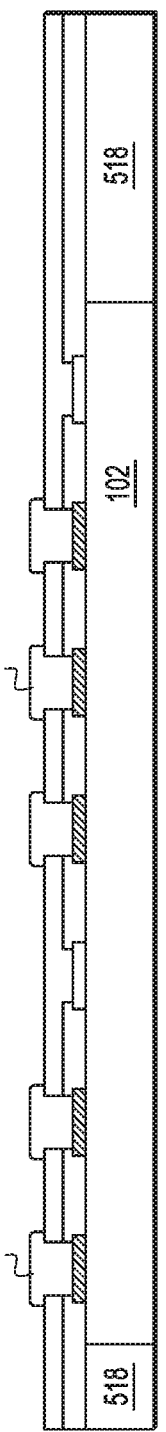

FIG. 10D shows the panel of embedded dies after under bump metallization pads 1014 are formed within each opening 1012 on the bonding surfaces of signal pads 1002. Under bump metallization (UBM) pads 1014 are formed from a thin film stack of one or more electrically conductive metals, examples of which include but are not limited to nickel, gold, copper, aluminum, titanium, tungsten, chromium, palladium, or other suitable conductive metal or alloy composed of one or more suitable conductive metals. UBM pads 1014 provide wettability and proper adhesion of external connections (such as solder bumps 1024, described below). For example, in some embodiments, UBM pads 1014 may be formed using an electroless plating process to form a stack of nickel, palladium, and gold in a "mushroom" shape having edges that overlap the dielectric layer 1010. The UBM pads 1014 are not formed on the antenna pads 1004, which remain covered by the dielectric layer 1010.

Figure 10E:
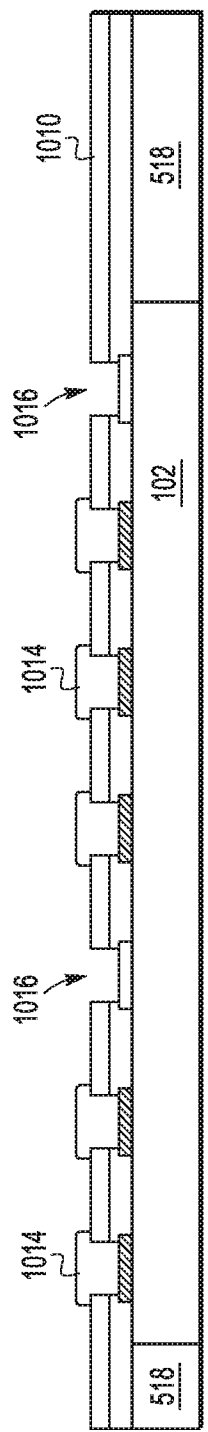

FIG. 10E shows the panel of embedded dies after a number of openings 1016 have been formed in dielectric layer 1010 that expose bonding surfaces of antenna pads 1004. Additional steps for forming openings in a dielectric layer (like the openings 1016 in dielectric layer 1010) may include depositing and patterning a photoresist material over the dielectric layer on the front side of panel of embedded dies, where the UBM pads 1014 remain covered by the patterned photoresist material, performing an etching process to remove portions of the dielectric layer to expose the bonding surfaces of antenna pads 1004, and removing the remaining photoresist material.

Figure 10F:
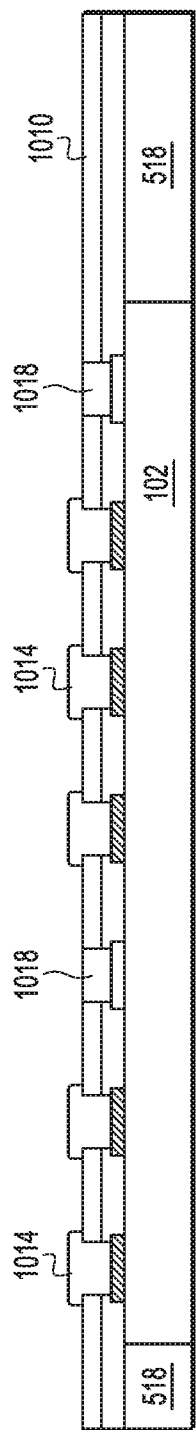

FIG. 10F shows the panel of embedded dies after forming a connector 1018 (like connector 406 discussed above) in each opening 1016, which is a conductive metal joint. The conductive metal used to form connector 1018 may be copper or other suitable conductive metal, noted above. In some embodiments, connector 1018 is a stud bump that may be formed using a capillary tool to attach a wire free air ball to the bonding surface of the antenna pad 1002 within opening 1016. In other embodiments, connector 1018 is a pillar that may be formed by a number of steps including depositing and patterning a photoresist material over the front side of the panel of embedded dies to form locations of the pillars on the antenna pads 1002 within openings 1016, where the photoresist material remains over the UBM pads 1014, electroplating the suitable metal to form pillars on the antenna pads 1002, and removing the remaining photoresist material. In the embodiment shown, connector 1018 is formed without pre-treatment of the antenna pads 1002 (e.g., does not require UBM), although antenna pads 1002 may be pre-treated in other embodiments. In the embodiment shown, connector 1018 fills the volume within the openings 1016 (e.g., a top surface of connector 1018 is coplanar with a top surface of the dielectric layer 1010, or side walls of connector 1018 is in contact with side walls of the openings 1016, or both). In other embodiments, connector 1018 may be narrower than the openings 1016 (e.g., see FIG. 11D), or taller than the openings 1016 (e.g., see FIG. 12C), or both, as discussed below.

Figure 10G:
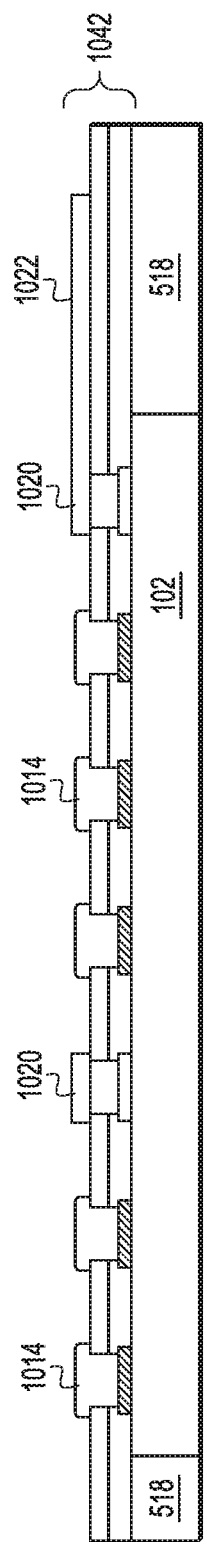

FIG. 10G shows the panel of embedded dies after forming metal layers 1020 and 1022 onto connectors 1018. Metal layers 1022 are representative of antennas 104 formed on the panel of embedded dies, and metal layers 1020 are representative of interconnects 106 or traces that connect the antennas 104 to connectors 1018. It is noted that the metal layer 1020 near the left side of FIG. 10G shows a representative cross-sectional view of a trace's width (e.g., shorter dimension), while the metal layer 1020 near the right side of FIG. 10G shows a representative cross-sectional view of a trace's length (e.g., longer dimension). In the embodiment shown, the width of a trace is larger than the width of the underlying connector 1018 and overlaps a portion of the surrounding dielectric layer 1010. It is also noted that the metal layer 1022 is representative of an antenna 104 formed over the panel body 518, which provides adequate surface area on which the antenna may be formed (e.g., rather than being formed over the active side of the RF die 102). The conductive metal used to form metal layers 1020 and 1022 may be copper or other suitable metal, as noted above. Additional steps for forming metal layers 1020 and 1022 may include depositing and patterning a photoresist material over the front side of the panel of embedded dies to form the locations of the traces and antennas, where the UBM pads 1014 remain covered by the patterned photoresist material, forming the traces and antennas by electroplating the suitable metal, and removing the remaining photoresist material. The traces and antennas may be formed using an alternative deposition process including but not limited to sputtering, spin coating, chemical vapor deposition (CVD), physical vapor deposition (PVD), and conformal depositing.

It is noted that the steps shown in FIG. 10A through 10G may be repeated in order to build a redistribution layer (RDL) structure 1042 on the front side of the panel of embedded dies, such as using fan out wafer level processing (FOWLP). The RDL structure 1042 may be formed from a number of dielectric and metal layers that in turn form a number of conductive traces extending through the RDL structure. In some embodiments, a set of conductive traces form interconnects 106 that connect the antenna pads 1004 to antennas 104, while another set of conductive traces may form additional interconnects between signal pads 1002 and pads on splitter dies 602, if present (e.g., see FIG. 15). Such an embodiment would reduce the number of transitions between the panel and the PCB and improve performance. In other embodiments, the RDL structure itself may form active circuitry that implements splitter functionality, such as by implementing passive RF elements that can be used to split or combine an RF signal like a Wilkinson divider circuit (e.g., see FIG. 18) or other suitable circuit, where a set of conductive traces may form additional interconnects between signal pads 1002 and the divider, as well as other passive components such as a resistor R (e.g., see FIG. 16). Further, sacrificial dielectric layers may be implemented in the RDL structure to improve RF performance (e.g., the presence of a dielectric material like mold compound material around any RF-sensitive areas contributes to signal degradation and negatively impacts RF performance), such as removing dielectric material from around antennas 104, from around interconnects to antennas 104, or both (e.g., see FIG. 14), which is further discussed below beginning with FIG. 11A. It is also noted that the various process steps discussed herein, such as depositing and patterning photoresist material, dielectric layers, or metal layers, may be combined or performed in a different order than described herein. Further, the process steps and materials are selected in such a way that previously applied materials are not eliminated or compromised prematurely (e.g., patterning of one layer should not damage underlying or previously patterned layers).

Figure 10H:
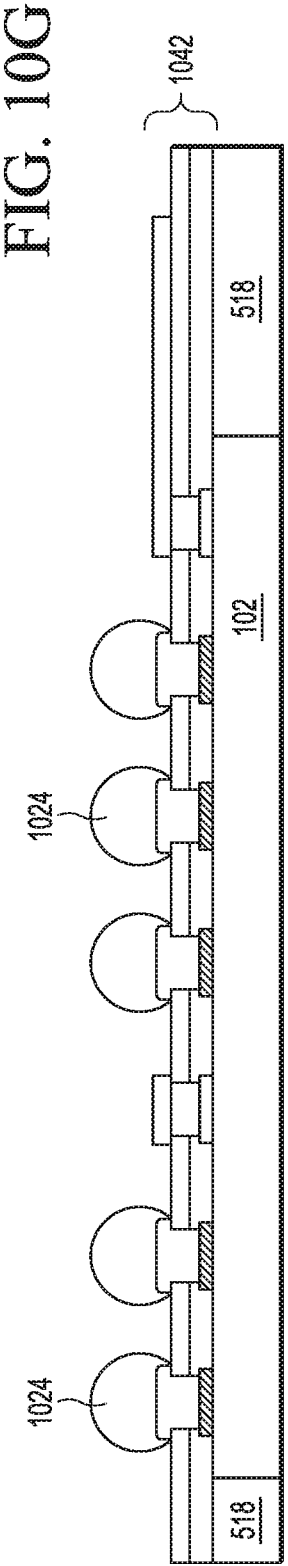

FIG. 10H shows the panel of embedded dies after ball drop is performed, where solder balls 1024 are attached to UBM pads 1014. In some embodiments, solder balls 1024 may be pre-formed solder spheres that are dropped on to the UBM pads 1014 and reflowed to ensure attachment of the solder balls 1024 to the UBM pads 1014. Solder balls 1024 may also be considered part of RDL structure 1042 (e.g., as a final layer of the RDL structure).

FIG. 10I shows the panel of embedded dies after overmolding. The front side of the panel of embedded dies including the solder balls 1024 and metal layers 1020 and 1022 are encapsulated with a mold compound material to form a mold body 1026, where the mold compound material and method of encapsulation are similar to those discussed above.

FIG. 10J shows the panel of embedded dies after a planarization step 1028 is performed to further reduce the thickness of the panel and form a new front side of the panel. Planarization step 1028 removes a portion 1030 of the mold body 1026 to expose a (new) front surface 1044 of a resulting mold compound layer 510, which is also referred to as a front side 1044 of the panel. The planarization step 1028 also removes a portion of each solder bump 1024 to expose a (new) front surface 1032 of each resulting (shorter) solder bump 512 in the front side 1044 of the panel, which are configured to be attached to a PCB. The planarization step 1028 may be performed using a grinding or CMP (chemical mechanical polishing) technique to achieve coplanar surfaces 1032 and 1044. The planarization step 1028 may also be followed by a polishing step, such as using dry polish, ultra fine grinding, or other suitable technique. The resulting panel 1050 shown in FIG. 10J may be one embodiment of the packaged semiconductor device.

FIG. 10K shows the panel of embedded dies after a laser step 1034 is performed. Laser step 1034 uses a laser to remove a portion of the mold compound layer 510 to form openings 1036 that form air gaps (also referred to as cavities 516 like that shown in FIGS. 5B and 5C) that expose outer surfaces 1038 of the metal layers 1020 and 1022 that form interconnects 106 and antennas 104. A laser step (like laser step 1034) may be implemented using a near infrared (NIR) laser (e.g., Nd:YAG laser) or a green (e.g., second harmonic generation) laser, or other suitable lasers such as those used in laser marking or solder ball decapping to remove dielectric material (like mold compound material) locally without damaging the underlying feature. The laser may be configured to cut into the panel at a depth where the metal layers 1020 and 1022 are encountered (e.g., using a feedback system of the laser system) or the laser may be configured to cut into the panel at some predetermined depth into the mold compound layer 510 to expose the metal layers 1020 and 1022. The laser step (like step 1034) effectively forms an air gap or cavity (like cavity 516) adjacent to the metal layers 1020 and 1022 that form the interconnects 106 and antennas 104 (e.g., the presence of a dielectric material like mold compound material around the interconnects and antennas contributes to signal degradation and negatively impacts RF performance).

In some embodiments, the cavities 1036 (or 516) are formed around the edges of metal layers 1020 and 1022 to laterally separate metal layers 1020 and 1022 from the mold compound layer 510 (similar to openings 1040 formed around the edges of solder balls 512, as shown in FIG. 10L). In some embodiments, the cavities 1036 are formed deeper to laterally separate metal layers 1020 and 1022 from dielectric layers in the RDL structure (e.g., similar to deeper versions of openings 1040 shown in FIG. 10L). In some embodiments, a portion of the mold compound layer 510 may also be removed from the active side 204 of the RF dies 102 around the RF-sensitive areas 208, which is beneficial for RF performance. The resulting panel 1055 shown in FIG. 10K (after laser step 1034) may be one embodiment of the packaged semiconductor device.

FIG. 10L shows the panel of embedded dies after a further laser step is performed to decap the solder balls 512. The further laser step uses the laser to remove a portion of the mold compound layer 510 to form openings 1040 around edges of the solder balls 512 and separate a contact portion of the solder balls 512 (which is a portion of the solder balls 512 that will contact landing pads of a PCB) from the mold compound layer 510. For example, the laser may be configured to cut into the mold compound layer 510 at some predetermined depth to form the openings 1040. Part of the remaining mold compound layer 510 remains at the outer ends of the antennas 104 (or layer 1022) to form a structural support 1046, which attaches to the lateral edges of layer 1022 to provide mechanical support for the antennas 104 (e.g., prevents damage to the antennas that might occur during shipment, vibration, or other handling of the resulting device). The resulting panel 1060 shown in FIG. 10L may be one embodiment of the packaged semiconductor device. In some embodiments, reflow may also be performed, causing the solder balls 512 to extend beyond the front surface 1044 and create standoff for the packaged semiconductor device (e.g., like that shown in FIG. 13). In such embodiments, an underfill material may be used around and in between the reflowed solder balls 512 when the packaged semiconductor device is mounted to a PCB, in order to provide improved mechanical attachment to the PCB. Such underfill material would be limited to the area around solder balls 512 and would not cover metal layers 1020 and 1022. Underfill material is generally a dielectric or insulating material with low CTE (coefficient of thermal expansion), examples of which include but are not limited to an epoxy-based system, or a low-CTE filler material (e.g., silica, alumina, boron nitride, and the like) in a liquid polymer that can be cured (e.g., by heat, ultraviolet light, and the like) into a solid composite material.

It is also noted that in some embodiments, the term "package body" may be used, which includes the panel body 518, mold compound layer 510, and any dielectric or RDL layers (such as layers 1006 and 1010). Also, the sizes of the openings (like openings 1036) that expose the outer surfaces 1038 of metal layers 1020 and 1022 may be smaller or larger than those shown in FIGS. 10K and 10L. For example, openings 1036 may be narrower to leave a portion of the mold compound layer 510 remaining over edges of the metal layers 1020 and 1022 (e.g., provide structural support 1046 that wraps over the end of the antennas 104 like that shown in FIG. 11M, discussed below), or may be wider to further expose a portion of the lateral edges of the metal layers 1020 and 1022 (e.g., expose sides of the interconnects 106 and antennas 104).

FIG. 11A-11M shows another example process flow for creating a packaged semiconductor device that includes both a panel of multiple RF dies and an array of antennas, which are arranged according to a layout of RF cells. In some embodiments, the panel of embedded dies may include both RF dies and splitter dies (like the panel of embedded dies shown in FIG. 9E), while in other embodiments the panel of embedded die may include only RF dies (similar to the panel of embedded dies shown in FIG. 9E without the splitter dies 602). While only one RF die 102 is shown in detail for simplicity's sake, this RF die 102 is representative of all RF dies 102 and the process described herein is applicable to all RF dies 102 of the panel. The process described in connection with the signal pads on the RF dies 102 may also applicable to any of the pads on the splitter dies 602 that may be optionally included in the panel of embedded dies (like that panel shown in FIG. 9E).

Figure 11A:
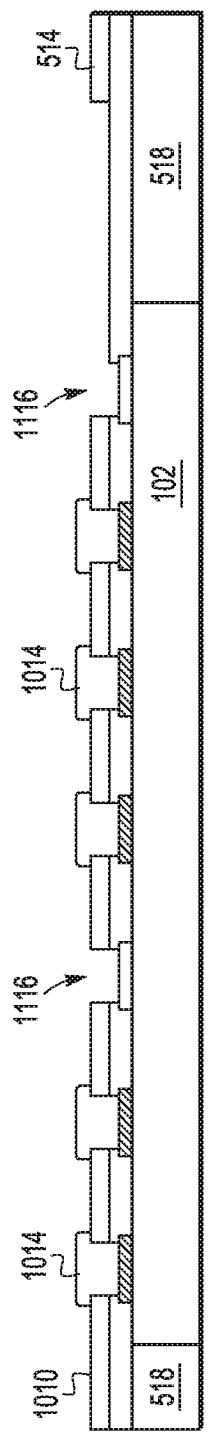

FIG. 11A shows a panel of embedded dies similar to that shown in FIG. 10E, after UBM pads 1014 have been formed and after a number of openings 1116 have been formed in dielectric layer 1010 that expose bonding surfaces of antenna pads 1004. However, openings 1116 also extend over a portion of the passivation layer 1006 above the panel body 518 to form a location for a sacrificial dielectric layer between the front side of the panel and the metal layers that form the antennas 104 and interconnects 106. A remaining portion 514 is also located in an area that will be between antenna 104 and panel body 518, which serves as a spacer for cavity 516 and part of a support structure for antenna 104, similar to portion 514 shown in FIG. 5C. The openings 1116 may be formed in dielectric layer 1010 as similarly discussed above.

Figure 11B:
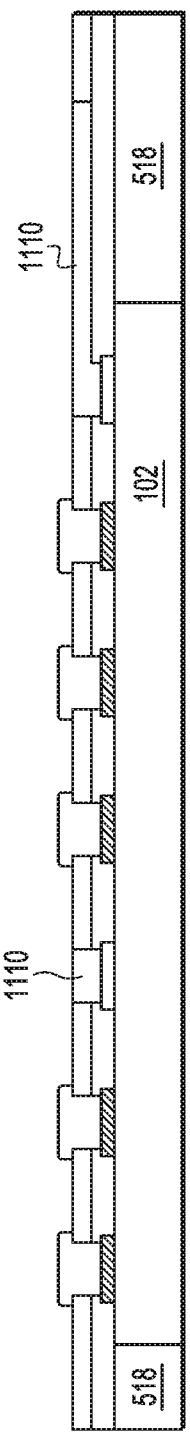

FIG. 11B shows the panel of embedded dies after a sacrificial dielectric layer 1110 is formed. Sacrificial dielectric layer 1110 is formed from a sacrificial dielectric material that is removable using a removal process, as discussed below in connection with FIG. 11J. Additional steps for forming sacrificial dielectric layer 1110 may include depositing and patterning a photoresist material over the front side of the panel of embedded dies to form the locations of the sacrificial dielectric layers, where the UBM pads 1014 remain covered by the patterned photoresist material, depositing the sacrificial dielectric material into the locations (e.g., by jetting, spin coating, and the like), and removing the remaining photoresist material. Examples of sacrificial dielectric material include but are not limited to removable materials based on polyalkylene carbonates, norbornene polymers or monomers, and the like. In the embodiment shown, sacrificial dielectric layer 1110 fills the volume within openings 1116 (e.g., a top surface of layer 1110 is coplanar with a top surface of the dielectric layer 1010). In other embodiments, sacrificial dielectric layer 1110 may be taller than the openings 1116 (e.g., see FIG. 12C), as discussed below. For example, a polyalkylene carbonate sacrificial dielectric material may decompose after extended exposure (e.g., 8 hours) to a temperature in the range of 175 C to 200 C (which is provided as a non-limiting example), even when the sacrificial dielectric material is covered by another organic material such as a mold compound material. However, it is preferred that an opening be provided to the sacrificial dielectric material to ensure removal of any residue or other byproducts that may form during decomposition. Various suitable sacrificial dielectric materials may be selected to implement layer 1110 based on their decomposition at different temperature ranges, with different exposure times, or both.

Figure 11C:
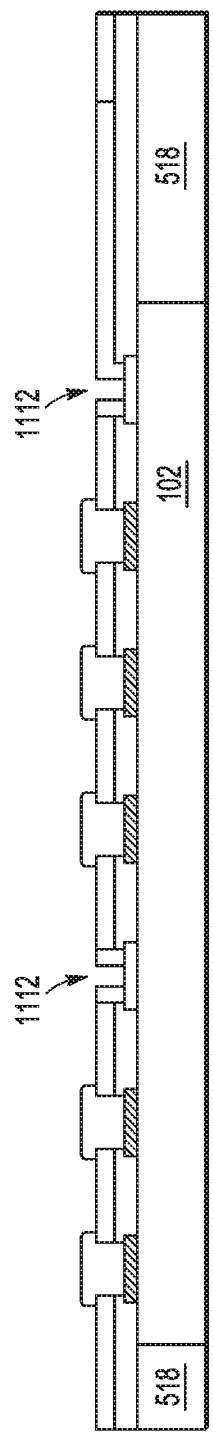

FIG. 11C shows the panel of embedded dies after sacrificial dielectric layer 1110 is patterned. Openings 1112 are formed in the sacrificial dielectric layer 1110 to expose the bonding surface of the antenna pads 1004 and provide a location in which a pillar may be formed. Additional steps for forming openings 1112 in sacrificial dielectric layer 1110 may include depositing and patterning a photoresist material over the front side of the panel of embedded dies to form locations of the openings, performing an etching process to remove portions of the sacrificial dielectric layer to expose the bonding surfaces of antenna pads 1004, and removing the remaining photoresist material.

Figure 11D:
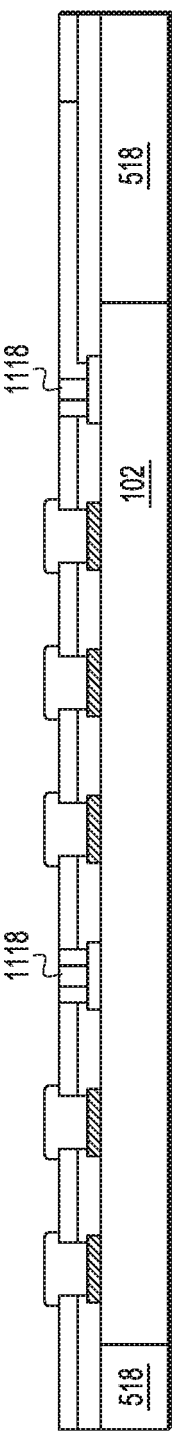

FIG. 11D shows the panel of embedded dies after forming connectors 1118 in each opening 1112. Connectors 1118 are conductive metal pillars that may be formed (e.g., electroplating) as similarly discussed above.

Figure 11E:
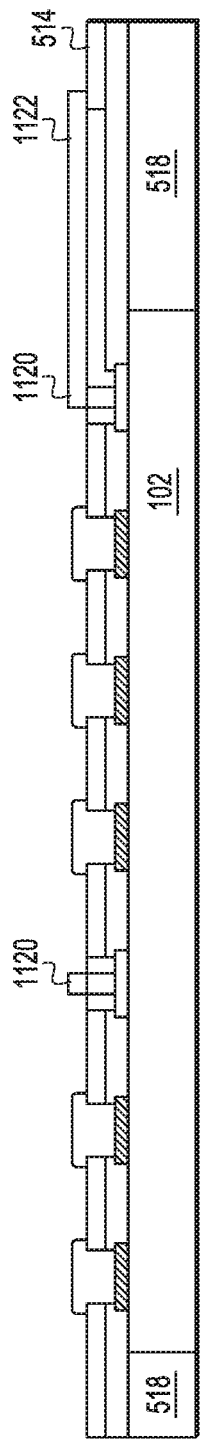

FIG. 11E shows the panel of embedded dies after forming metal layers 1120 and 1122 onto connectors 1118. Metal layers 1120 and 1122 may be formed similarly to metal layers 1020 and 1022, using any of the approaches discussed above. In the embodiment shown, the metal layers 1120 or traces have a width (e.g., shown on the left side of FIG. 11E) comparable to the width of the connectors 1118. The traces may overlap a portion of the surrounding sacrificial dielectric layer 1110, but do not go so far as to overlap the surrounding dielectric layer 1010. Preferably, a volume is maintained laterally around the trace (e.g., between an edge of the trace and an edge of the underlying sacrificial dielectric layer 1110) that will be filled with additional sacrificial dielectric material to form a continuous gap or cavity around the trace (and the antennas 104) once the sacrificial dielectric material is removed. It is also noted that metal layer 1122 (which forms antenna 104) extends over portion 514 of the underlying dielectric layer 1010, which forms an anchor or structural support for antenna 104 after the sacrificial dielectric material is removed (e.g., the edge portion of the antenna 104 remains attached to the dielectric layer 1010 after the sacrificial dielectric material is removed).

Figure 11F:
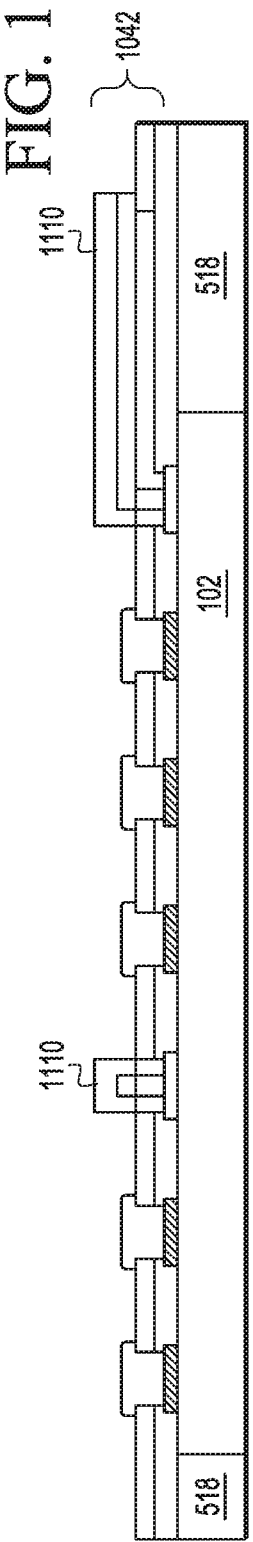

FIG. 11F shows the panel of embedded dies after another sacrificial dielectric layer 1110 is formed over the metal layers 1120 and 1122, in a manner similar to that described above. The double layers of sacrificial dielectric layers 1110 around the metal layers 1120 and 1122 define a continuous volume in which cavity 516 will be located after the sacrificial dielectric layers 1110 are removed, as further discussed below.

It is noted that FIG. 11A through 11F (and FIG. 10A through 10D) may be repeated in order to build an RDL structure 1042 on the front side of the panel of embedded dies, where one or more sacrificial dielectric layers 1110 may be used to define one or more cavities around portions of the antennas, traces, or both, as similarly discussed above.

Figure 11G:
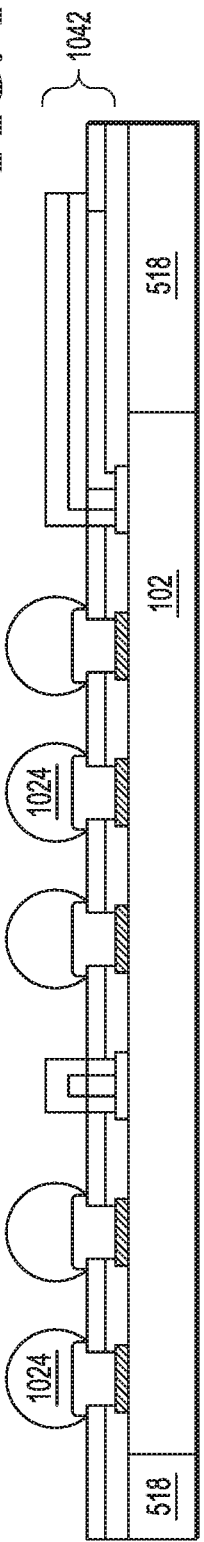

FIG. 11G shows the panel of embedded dies after ball drop is performed, where solder balls 1024 are attached to UBM pads 1014, as similarly discussed above. Solder balls 1024 may also be considered part of RDL structure 1042 (e.g., as a final layer of the RDL structure).

Figure 11H:
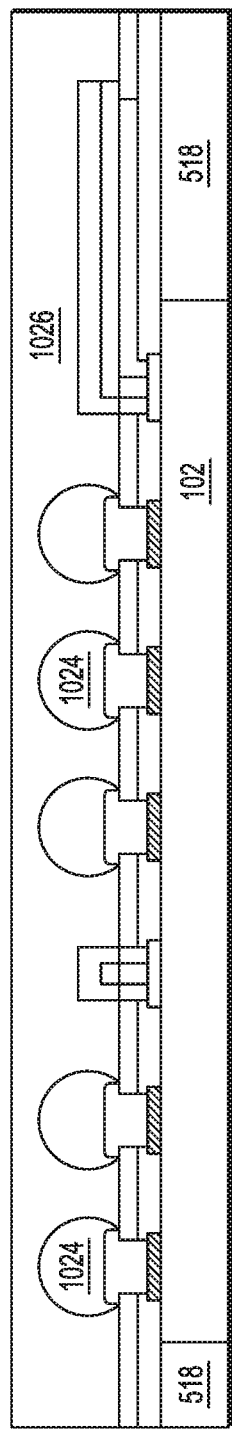

FIG. 11H shows the panel of embedded dies after overmolding to form mold body 1026 that encapsulates solder balls 1024, sacrificial dielectric layers 1110, and metal layers 1120 and 1122, as similarly discussed above.

FIG. 11I shows the panel of embedded dies after a planarization step 1028 is performed, as similarly discussed above. Also as noted above, a package body may include panel body 518, the mold compound layer 510, and any dielectric layers or RDL layers (such as layers 1006 and 1010). The resulting panel 1150 shown in FIG. 11I may be one embodiment of the packaged semiconductor device.

FIG. 11J shows the panel of embedded dies after a laser step 1034 is performed, as similarly discussed above. In the embodiment shown, the laser step 1034 removes both a portion of mold compound layer 510 and a portion of the sacrificial dielectric layer 1110 to expose the top surface of metal layers 1120 and 1122. In other embodiments, the laser step 1034 may remove the portion of mold compound layer 510 to expose a surface of the sacrificial dielectric layer 1110, where a removal process is performed to remove the remaining sacrificial dielectric layer(s) 1110 and expose outer surfaces 1038 of the metal layers 1120 and 1122, further discussed below. Part of the remaining mold compound layer 510 remains at the outer ends of the antennas 104 (or layer 1122), attaching to the lateral edges of layer 1122 to provide mechanical support. The resulting panel 1160 shown in FIG. 11J may be one embodiment of the packaged semiconductor device.

FIG. 11K shows the panel of embedded dies after a removal step 1140 is performed. The removal step 1140 implements a removal process to remove sacrificial dielectric layer(s) 1110 and form air gaps or cavities 1142 (also referred to as cavities 516) around metal layers 1120 and 1122 that form antennas 104 and interconnects 106. Examples of a removal process include but are not limited to wet etching (e.g., a liquid etchant or solvent that removes the sacrificial dielectric material, which for example may include one or more of hydrofluoric acid, nitric acid, acetic acid, and the like), dry etching such as gas etching (e.g., a gas etchant or mixture that is released to remove the sacrificial dielectric material), thermal removal (e.g., heating the sacrificial dielectric material to an excursion point at which the sacrificial dielectric material breaks down or decomposes), or other removal process (e.g., decomposition through exposure to ultraviolet light, oxygen gas (O2), heat, or any combination thereof). In the embodiment shown, the sacrificial dielectric layers 1110 are exposed in the mold compound layer 510, which is beneficial for a wet etchant or gas etchant to reach the sacrificial dielectric layers 1110 between the metal layer 1122 and the front side of the panel (e.g., the layer 1110 underneath the metal layers 1120 and 1122).

In the embodiment shown, the inner surfaces 1144 (opposite outer surfaces 1038) of the metal layers 1120 and 1122 forming the antennas 104 and interconnects 106 are also exposed by cavities 1142. In some embodiments, the cavities 1142 laterally separate metal layers 1120 and 1122 from the mold compound layer 510, as shown on the left of FIG. 11K. In some embodiments, the cavities 1142 laterally separate metal layers 1120 (or connectors 406) and 1122 from dielectric layers in the RDL structure. In some embodiments, the cavities 1142 may further vertically separate metal layers 1120 and 1122 from dielectric layers in the RDL structure. In the embodiment shown, the portion of dielectric material 514 formed underneath the outer ends of layer 1122 acts as a spacer, creating a gap or space between an inner surface 1144 of the metal layers and a front side of the underlying panel body 518 when the sacrificial dielectric layers are removed. In other embodiments, such as when using thermal removal, the sacrificial dielectric layers 1110 may not be required to be exposed through an opening in order to be removed or decomposed, although such exposure in an opening is preferred to ensure any residue or decomposition products are sufficiently removed from the cavity 1142. The portion 514 together with the remaining mold compound layer 510 around the lateral side of the layer 1122 acts as a structural support 1146, which provides mechanical support for the antennas 104. The resulting panel 1170 shown in FIG. 11K may be one embodiment of the packaged semiconductor device. In some embodiments, the solder balls 512 may also be decapped, like that shown in FIG. 10L, as similarly discussed above.

FIG. 11L shows a panel of embedded die 1155 that implements another embodiment of the packaged semiconductor device. Panel 1155 is similar to panel 1150, except that the sacrificial dielectric layer 1110 over metal layer 1122 does not extend to the edge of metal layer 1122. This arrangement allows the mold compound layer 510 to reach a portion of the top surface of metal layer 1122 that forms the outer end of antenna 104. When laser step 1034 is performed, a portion of mold compound layer 510 may then remain over the outer end of antenna 104, an example of which is shown in FIG. 11M. The portion 514 together with the remaining mold compound layer 510 around the outer end of layer 1122 acts as a structural support 1148, which provides reinforced mechanical support for the antennas 104. The resulting panel 1165 shown in FIG. 11M may be one embodiment of the packaged semiconductor device.

FIG. 12A-12F are block diagrams depicting a number of example process flow steps that may be performed as alternate steps in the process flow described above in connection with FIG. 11A-11K. The alternate steps shown in FIG. 12A-12F may be implemented to achieve a thicker sacrificial dielectric layer 1210, to achieve taller connectors 1218, to achieve wider metal layers or traces 1220, to achieve a greater gap distance between the antennas and the front side of the panel of embedded dies, or any combination thereof.

Figure 12A:
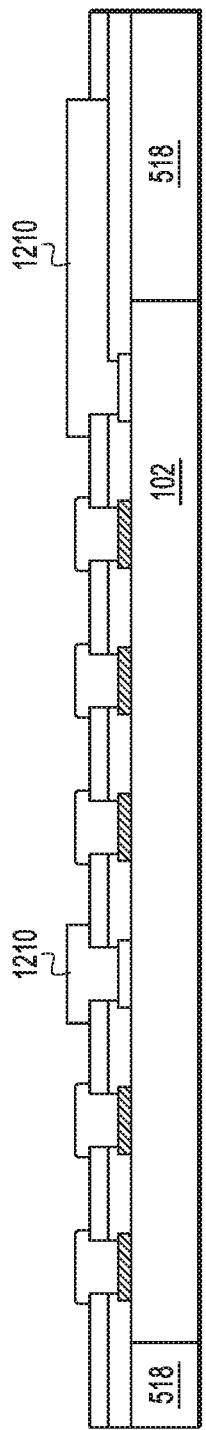
FIG. 12A-12F are block diagrams depicting alternate process flow steps for creating a packaged semiconductor device, according to some embodiments of the present disclosure.

FIG. 12A shows a panel of embedded dies like that shown in FIG. 11B, after a sacrificial dielectric layer 1210 has been formed in openings 1116 in the dielectric layer 1010. However, the sacrificial dielectric layer 1210 extends beyond the top surface of the dielectric layer 1010 (e.g., the sacrificial dielectric layer 1210 is taller than the opening 1116). The sacrificial dielectric layer 1210 extends over or overlaps a portion of the surrounding dielectric layer 1010. The sacrificial dielectric layer 1210 may be formed as similarly discussed above.

Figure 12B:
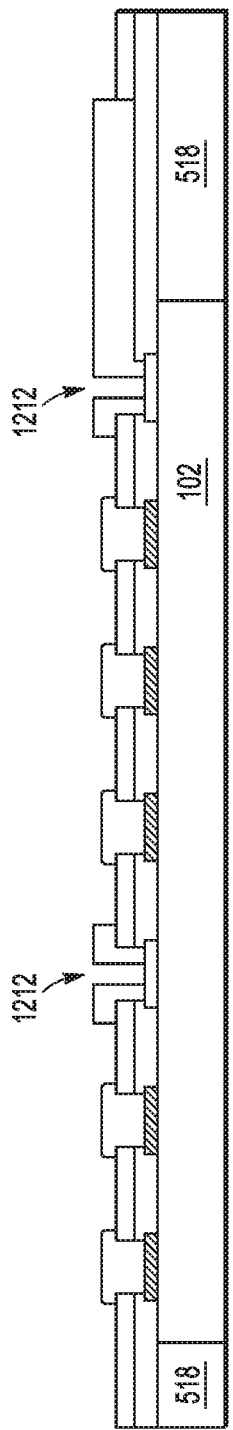

FIG. 12B shows the panel of embedded dies after the sacrificial dielectric layer 1210 is patterned to form openings 1212 to expose the bonding surface of the antenna pads 1004 and provide a location in which a pillar may be formed. The openings 1212 may be formed as similarly discussed above.

Figure 12C:
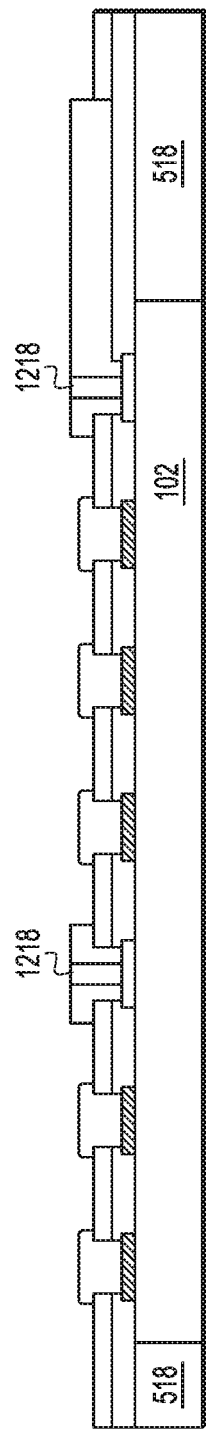

FIG. 12C shows the panel of embedded dies after the connectors 1218 are formed in each opening 1212, where the connectors 1218 also extend beyond the top surface of the dielectric layer 1010 (e.g., the connector 1218 is taller than the opening 1116). The connectors 1218 may be formed as similarly discussed above.

Figure 12D:
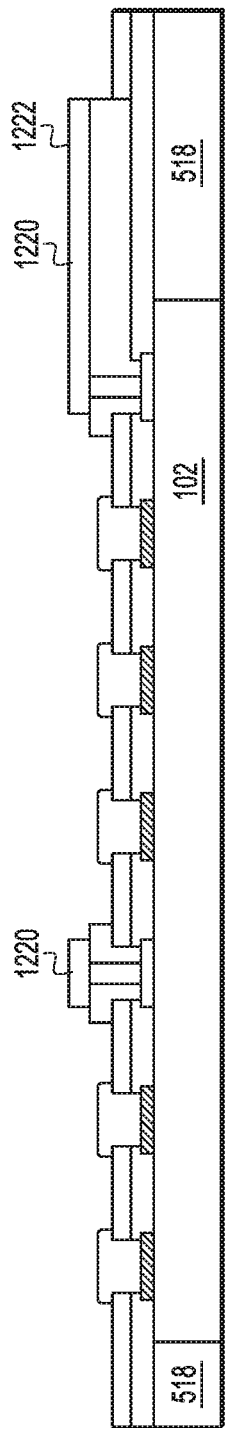

FIG. 12D shows the panel of embedded dies after forming metal layers 1220 and 1222 onto connectors 1218. In the embodiment shown, the metal layers or traces 1220 have a width (e.g., shown on the left side of FIG. 12D) that is wider than the width of the connectors 1218. The traces may overlap a portion of the surrounding sacrificial dielectric layer 1210, but do not overlap the entire surrounding sacrificial dielectric layer 1210 in order to maintain a volume laterally around the trace to form a continuous gap or cavity around the trace (and antennas) once the sacrificial dielectric material is removed.

Figure 12E:
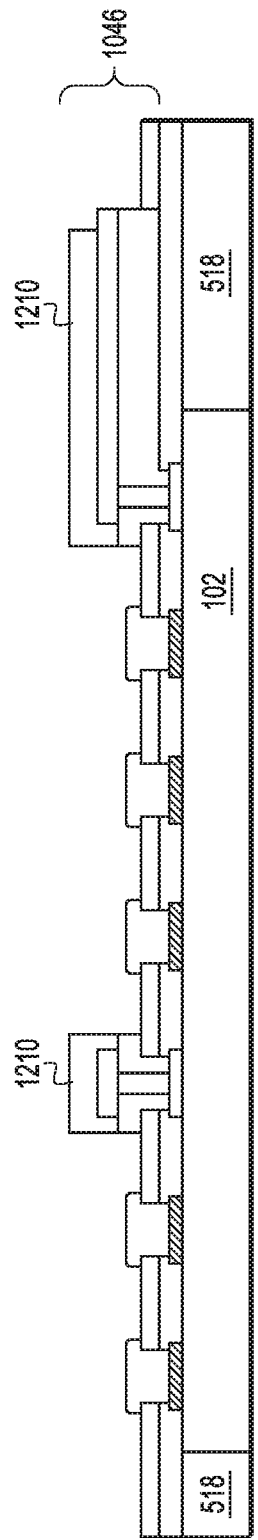

FIG. 12E shows the panel of embedded dies after forming an additional sacrificial dielectric layer 1210 over and around the metal layers 1220. In the embodiment shown, the additional sacrificial dielectric layer 1210 does not completely cover the metal layers 1222 that form antennas 104, which instead leaves a volume of space over the edges of the antennas (e.g., between an outer edge of the additional sacrificial dielectric layer 1210 and an outer edge of the metal layer 1222). This volume is filled with mold compound material during overmolding and covers the outer ends of the metal layer 1222 (like that shown in FIG. 11L).

Figure 12F:
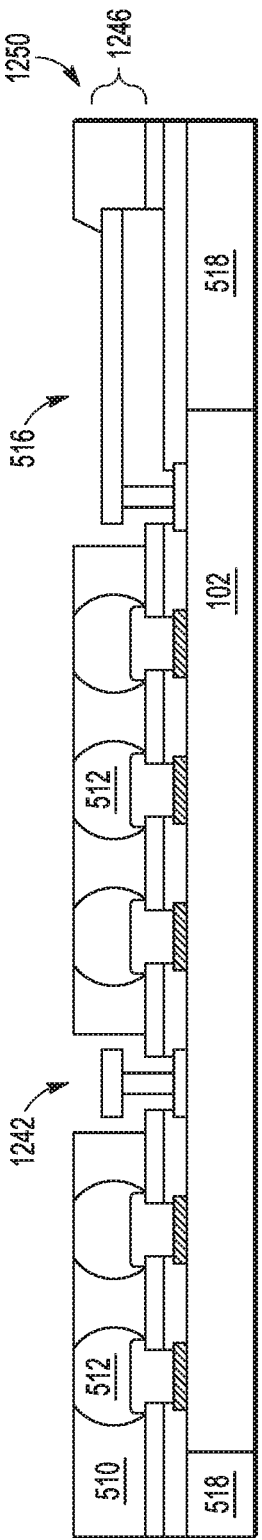

FIG. 12F shows the panel of embedded dies after ball drop, overmolding, planaraization, laser, and removal steps have been performed, as similarly discussed above in connection with FIG. 11G-11K. The resulting panel 1250 has continuous gaps or cavities 1242 (or cavities 516) around the metal layers that form interconnects 106 and antennas 104, providing improved RF performance. The remaining mold compound layer 510 over the outer end of layer 1222 acts as a structural support 1246, which provides mechanical support for the antennas 104. The resulting panel 1250 shown in FIG. 12F may be one embodiment of the packaged semiconductor device. In some embodiments, the solder balls 512 may also be decapped, like that shown in FIG. 10L, discussed above.

FIG. 13 shows an exploded view of an example device 1300 that includes an example packaged semiconductor device 1350 fabricated using a fabrication process like those discussed above (e.g., like any of the processes discussed in connection with FIG. 9A-9E, 10A-10L, 11A-11M, or 12A-12F). In the embodiment shown, device 1350 includes both RF dies 102 and splitter dies 602, as well as an optional metallization layer 918 that contacts the back sides of the RF dies 102 and splitter dies 602. Also in the embodiment shown, device 1350 includes an array of antennas 104 that are exposed to free space through the mold compound by cavities 516 for improved RF performance. In the embodiment shown, cavities 516 form air gaps adjacent to a pair of antennas 104. In other embodiments, the cavities 516 may also extend around antennas 104 like that shown in FIG. 14 (e.g., using sacrificial dielectric material, as discussed above).

As shown, a thermal interface material (TIM) 1306 is attached to the back side of the packaged semiconductor device 1350, which is formed by metallization layer 918. TIM 1306 is heat conductive. In some embodiments, TIM 1306 is also attached to a cooling system 1302, which in the embodiment shown includes one or more heat pipes 1304. In some embodiments, cooling system 1302 also includes a heat sink or heat spreader around the one or more heat pipes 1304, which may be formed of aluminum, aluminum alloys, copper, copper alloys, boron nitride, aluminum nitride, diamond, carbon nanotubes, and combinations thereof. Since the back sides of the RF dies 102 and splitter dies 602 are ensured to be co-planar (due to the planarization step 910), an efficient thermal conductivity path is formed between a planar surface of the cooling system 1302 (e.g., the heat sink or spreader) and each back side of the dies 102 and 602 via the metallization layer 918 and the TIM 1306, providing improved thermal transfer. Further, since the RF dies 102 and splitter dies 602 are thinned, the thermal conductivity path reaches closer to the active circuitry generating the heat for improved thermal transfer. Examples of TIM include, but are not limited to, silicone or epoxy-based materials containing suspended carbon nanotubes, or beryllium oxide, aluminum nitride, boron nitride, or diamond powders. In some embodiments, metallic fillers like silver can also be used. In some embodiments, TIM can be a phase-change metal alloy, a graphene-based adhesive, and the like.

It is noted that a heat pipe 1304 system is a highly effective thermal conductor designed for long-term operation with practically no maintenance, as compared with a forced ventilator or fan system that includes motors subject to break down when continuously run for long-term operation. A forced ventilator or fan system may also require a heat sink or heat spreader, which may lack an efficient thermal conductivity path to each and every die, depending on whether the (possibly non-planar die) make sufficient thermal contact with a planar surface of the heat sink (e.g., the die may be non-planar due to some degree of tilt).

An interface between packaged semiconductor device 1350 and PCB 402 is also shown in FIG. 13. Device 1350 implements an array of embedded dies (including both RF dies 102 and splitter dies 602) based on a layout that is also implemented by the PCB 402. The array of embedded dies in the device 1350 have a number of exposed solder balls 512, which align with a number of landing pads 408 on the PCB 402. In the embodiment shown, reflow has been performed, causing the solder balls 512 to extend beyond the planarized front side of the panel 1350 and create standoff for device 1350. It is noted that the general placement of the solder balls 512 and landing pads 408 herein are provided for illustrative purposes and may not indicate proper alignment in a real world implementation. Further, the device components, such as RF dies 102, splitter dies 602, branching circuits 1602 (discussed below), solder balls 512, signal lines 608, antennas 104, and cavities 516, are not limited to the arrangement or configuration shown in the following figures, but instead may be implemented in any number of combinations (e.g., a device may have any combination of components or features different than the combinations shown, examples of which may include but are not limited to a device that includes solder balls 512 on both RF dies 102 and splitter dies 602, optionally in combination with cavities 516 that expose an inner surface of the antennas 104, and optionally in combination with signal lines 604 implemented in the device).

In some embodiments, the solder balls 512 may be attached to the landing pads 408 using solder paste, solder balls, or other forms of solder attachment, in combination with a reflow process. In some embodiments, an underfill material may be used around the reflowed solder balls 512 (without covering neighboring interconnects 106 or antennas 104) to provide improved mechanical robustness of the device. The landing pads 408 connected to the splitter dies 602 provide connections to signal lines 604 in the PCB 402. Some of the landing pads 408 connected to the RF dies 102 provide connections to RF signal lines 604, while other landing pads 408 connected to the RF dies provide ground, power supply, and non-RF signal lines. In some embodiments, reflectors 404 may be implemented on a back side of PCB 402. In other embodiments, the reflectors 404 may be implemented as an array internal to PCB 402, where additional grounding elements may also be implemented in PCB 402.

Since signal lines 604 are implemented in the PCB 402 in the embodiment shown, the RF signal is routed back and forth between the device 1350 and the PCB 402. For example, a transmission RF signal may be routed from a (first) signal line 604 on the PCB 402, transitions to a splitter die 602 in the packaged semiconductor device 1350, transitions to a pair of subsequent signal lines 604 on the PCB 402, and (ultimately) transitions to a pair of RF die 102 in the packaged semiconductor device 1350 for transmission on antennas 104, where signal degradation may occur at each transition. Other embodiments that minimize the back-and-forth nature of this RF signal routing are further discussed below in connection with FIGS. 15 and 16, which may minimize signal loss by reducing the number of transitions between the PCB 402 and the device 1350.

FIG. 14 shows an exploded view of another example device that includes an example packaged semiconductor device 1450 fabricated using a fabrication process like those discussed above. In the embodiment shown, the PCB 402 includes functionality 1602 of the splitter die, such as by implementing active circuitry that can be used to split or combine an RF signal like a Wilkinson divider circuit (e.g., shown in FIG. 18, further discussed below). Device 1450 includes solder balls 512 on RF dies 102, where some solder balls 512 are connected to landing pads 408 that provide connections to RF signals 604 in the PCB 402, while other solder balls 512 are connected to landing pads 408 that provide connections to ground, power supply, and non-RF signal lines. Such an embodiment reduces the number of transitions between the device 1450 and the PCB 402. Also in the embodiment shown, device 1450 includes an array of antennas 104 that are exposed to free space through the mold compound by cavities 516 for improved RF performance, where cavities 516 are formed to extend around each antenna 104 (e.g., using sacrificial dielectric material, as discussed above). In other embodiments, the cavities 516 may be limited to exposing an outer surface of each antenna 104 (e.g., like that shown in FIG. 13).

It is noted that the example processes discussed above can be modified to implement fan out wafer level processing (FOWLP) using redistribution layers (RDL) to move the signal lines 604 to the packaged semiconductor device (and out of the PCB 402), which reduces the number of transitions between the resulting packaged semiconductor device and the PCB 402. For example, the formation of the RDL structure shown in FIG. 10G or in FIG. 11F or in FIG. 12E can be modified to form an RDL structure that includes the signal lines 604 formed among splitter dies 602 and RF dies 102 in the packaged semiconductor device.

FIG. 15 shows an exploded view of another example device that includes an example packaged semiconductor device 1550 fabricated using a fabrication process like those discussed above, including the modified RDL structure. Device 1550 includes an array of antennas 104 that are exposed to free space in cavities 516 formed in the modified RDL structure, which form air gaps adjacent to the antennas 104 or may wrap or extend around antennas 104, as discussed above. Device 1550 includes an RDL structure that forms the branching RF signal path (e.g., like the path shown in FIG. 7), where the conductive traces of the RDL structure (in addition to forming interconnects 106 and antennas 104) also form signal lines 604 between signal pads on the RF dies 102 to signal pads on the splitter dies 602. The RDL structure may also form other lines (e.g., ground lines) to the signal pads on the splitter dies 602, where the splitter dies 602 no longer need to be bumped at all. The signal pads on the RF dies 102 that are connected to the splitter dies 602 by RF signal lines 604 also do not need to be bumped. Such an embodiment also allows RF signal lines 604 and corresponding landing pads 408 to be removed from the PCB 402 (e.g., simplifying the PCB fabrication process). The embodiment shown in FIG. 15 minimizes the transitions from the PCB 402 to the device 1550 (e.g., reduces the transitions to one, where the RF signal may be provided to a master port 610 on the device 1550), which reduces signal degradation and improves RF performance.

FIG. 16 shows an exploded view of another example device that includes an example packaged semiconductor device 1650 fabricated using a fabrication process like those discussed above, including the modified RDL structure. Device 1550 includes an array of antennas 104 that are exposed to free space in cavities 516 formed in the modified RDL structure, which form air gaps adjacent to the antennas 104 or may wrap or extend around antennas 104, as discussed above. Device 1650 includes an RDL structure that further implements the functionality 1602 of each splitter die 602. Such an embodiment omits placing the splitter dies 602 as individual dies on the temporary carrier 902 in the step shown in FIG. 9A. Instead, active circuitry or branching circuits 1602 (shown in dashed outline) may be formed within the RDL structure on device 1650, which implements the power splitter, power combiner, or both. Examples of active circuitry in branching circuits 1602 include a resistive splitter circuit, a branch line coupler circuit, a large coupler circuit, a hybrid coupler circuit (e.g., a rat race coupler circuit), a Wilkinson power divider circuit, or similar circuit structure, which may be used as either a power splitter or a power combiner (e.g., the direction of the RF signal propagation changes based on a transmit or receive mode of the device). In other embodiments, each branching circuit 1602 may implement a dedicated power splitter (e.g., for a dedicated transmitter device 1702 like that shown in FIG. 17) or a dedicated power combiner (e.g., for a dedicated receiver device 1704 like that shown in FIG. 17).

Figure 18:
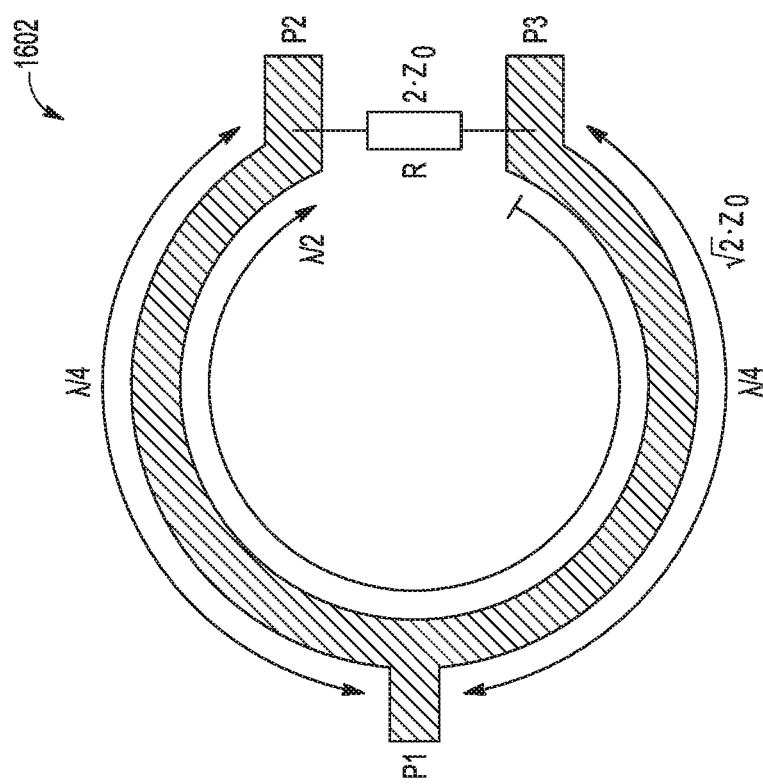
FIG. 18 is a block diagram depicting an example component implementing splitter functionality that may be implemented in packaged semiconductor device attached to a PCB, according to some embodiments of the present disclosure.

In some embodiments, branching circuitry 1602 may be implemented using a Wilkinson power divider circuit, like that shown in FIG. 18, which is capable of being used as both a power splitter and a power combiner (e.g., controlled to implement a power splitter during a transmit mode, or a power combiner during a receive mode). A Wilkinson divider circuit uses quarter wave transformers between a first (or upstream) port P1 and two branch (or downstream) ports P2 and P3, which may be implemented using microstrip technology in the RDL structure. A quarter wave ($\lambda$/4) transformer is located between ports P1 and P2, and another quarter wave transformer is located between ports P1 and P3, resulting in a half wave ($\lambda$/2) transformer between ports P2 and P3. The quarter wave transformer may have an impedance equal to an input impedance Zo times the square root of 2 (or $\sqrt{2}\cdot$Zo). A resistance R is also connected between ports P2 and P3 (where a portion of R is shown in FIG. 16 between ports P2 and P3), where resistance R may be equal to two times the input impedance Zo (or 2·Zo). In some embodiments, the Wilkinson divider circuit may be implemented using IC technology or may be formed as a discrete component. For example, the splitter dies 602 are replaced by branching circuits that each implement a Wilkinson divider circuit, which includes a passive resistor R connected to signal lines 604. The splitter functionality 1602 may also be implemented using Wilkinson divider circuits in the PCB 402, as shown in FIG. 14.

The RDL structure also forms the branching RF signal path (e.g., like the path shown in FIG. 7), where the conductive traces of the RDL structure (in addition to forming interconnects 106 and antennas 104) also form signal lines 604 between signal pads on the RF dies 102 to respective ports of the branching circuits 1602. The signal pads on the RF dies 102 that are connected to the branching circuits 1602 by signal lines 604 do not need to be bumped. Such an embodiment also allows signal lines 604 and corresponding landing pads 408 to be removed from the PCB 402 (e.g., simplifying the PCB fabrication process). The embodiment shown in FIG. 16 minimizes the transitions from the PCB 402 to the device 1650 (e.g., reduces the transitions to one, where the RF signal may be provided to a master port 610 on the device 1650), which reduces signal degradation and improves RF performance.

The RF dies 102 described herein may be formed and singulated from a semiconductor wafer (also referred to as simply wafer), which can be any semiconductor material or combinations of materials, such as gallium arsenide, silicon germanium, silicon-on-insulator (SOI), silicon, monocrystalline silicon, the like, and combinations of the above. The splitter dies 602 described herein may also be formed and singulated from a semiconductor wafer, which may use WLCSP (wafer level chip scale processing). The active circuitry for the RF dies 102 and the splitter dies 602 is formed using a sequence of numerous process steps applied to the wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, analog circuitry, sensor, MEMS (microelectromechanical systems) device, a standalone discrete device such as a resistor, inductor, capacitor, diode, power transistor, and the like.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node or feature is directly or indirectly joined to (or is in direct or indirect communication with) another node or feature, and not necessarily physically. As used herein, unless expressly stated otherwise, "connected" means that one node or feature is directly joined to (or is in direct communication with) another node of feature. For example, a switch may be "coupled to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

By now it should be appreciated that there has been provided embodiments of packaged semiconductor devices and embodiments of fabricating such devices that include both an array of RF dies and an array of antennas, where such devices may include hundreds of dies and hundreds of antennas. The presently disclosed device includes an array of antennas formed over an active side of a panel of embedded RF dies, where each RF die is connected to a set of antennas that may be exposed to the ambient environment (e.g., free space) by one or more cavities, which may be formed around each antenna, providing air gaps above, below, lateral, or any combination thereof to each antenna.

In one embodiment of the present disclosure, a multi-die packaged semiconductor device is provided, which includes: a panel of embedded dies including a plurality of radio frequency (RF) dies, wherein each RF die includes RF front-end circuitry, each RF die has an active side that includes a plurality of pads, each RF die has a back side exposed in a back side of the panel; a plurality of antenna connectors formed on a subset of the plurality of pads of each RF die; and an array of antennas formed over a front side of the panel and connected to the plurality of antenna connectors.

One aspect of the above embodiment provides that the multi-die packaged semiconductor device further includes: a mold compound layer formed over the front side of the panel, wherein a cavity is formed in the mold compound layer to expose an outer surface of each antenna.

A further aspect of the above embodiment provides that the cavity is further formed in the mold compound layer around each antenna to laterally separate each antenna from the mold compound layer.

Another further aspect of the above embodiment provides that at least a portion of each cavity is located between each antenna and the front side of the panel to expose an inner surface of each antenna.

Another further aspect of the above embodiment provides that at least a portion of the mold compound layer forms a structural support at an outer end of each antenna.

Another aspect of the above embodiment provides that the multi-die packaged semiconductor device further includes: a redistributed layer (RDL) structure formed on the front side of the panel, wherein the plurality of antenna connectors and the array of antennas are formed as part of the RDL structure.

A further aspect of the above embodiment provides that a cavity is formed around each antenna connector and antenna to laterally separate each antenna connector and antenna from dielectric material in the RDL structure.

Another further aspect of the above embodiment provides that the RDL structure further includes: a plurality of under bump metallization (UBM) pads formed on a remaining subset of the plurality of pads of each RF die, and a plurality of solder balls on the plurality of UBM pads; and the multi-die packaged semiconductor device further includes: a mold compound layer formed over and on the RDL structure, wherein the mold compound layer laterally surrounds the plurality of solder balls.

A further aspect of the above embodiment provides that a plurality of openings are formed around the plurality of solder balls to separate a contact portion of the solder balls from the mold compound layer.

Another further aspect of the above embodiment provides that the panel of embedded dies further includes a plurality of RF branching dies located among the RF dies, each RF branching die has a set of pads on an active side of the RF branching die, and each RF die has a respective RF signal pad on the active side of the RF die.

A further aspect of the above embodiment provides that the front-end circuitry of each RF die is coupled to the respective RF signal pad, solder balls formed on the respective RF signal pads of the RF dies are configured to be attached to landing pads on the PCB, solder balls formed on the set of pads of the RF branching dies are configured to be attached to other landing pads on the PCB, and a plurality of RF signal lines are implemented in the PCB as part of an RF signal path tree from the respective RF signal pads of the RF dies through the RF branching dies to a device master port.

Another further aspect of the above embodiment provides that the RDL structure further includes: a plurality of conductive traces that form RF signal lines of an RF signal path tree from the respective RF signal pads of the RF dies through the RF branching dies to a device master port.

Another aspect of the above embodiment provides that the multi-die packaged semiconductor device further includes: a redistributed layer (RDL) structure formed on the front side of the panel, wherein the RDL structure implements an RF signal path tree including: a plurality of RF branching circuits located among the RF dies, and a plurality of conductive traces that form RF signal lines of the RF signal path tree from respective RF signal pads of the RF dies through the RF branching circuits to a device master port.

Another aspect of the above embodiment provides that the multi-die packaged semiconductor device further includes: a metallization layer on the back side of the panel, which directly contacts the back side of each of the RF dies.

A further aspect of the above embodiment provides that the multi-die packaged semiconductor device further includes: a heat transfer system attached to the metallization layer with thermal interface material, wherein the heat transfer system includes a heat pipe.

Another aspect of the above embodiment provides that the plurality of antenna connectors includes one of a group including copper pillars and copper stud bumps.

Another further aspect of the above embodiment provides that the set of pads of each RF branching die provides connections to an upstream port and two downstream ports.

A further aspect of the above embodiment provides that the RF branching dies are configured to split an RF signal present at the upstream port into two substantially equal RF signals at the downstream ports, and the RF dies are configured to transmit the RF signal on at least one antenna.

Another further aspect of the above embodiment provides that the RF dies are configured to receive an RF signal on at least one antenna, and the RF branching dies are configured to combine the RF signal at the downstream ports into a single RF signal at the upstream port.

Another further aspect of the above embodiment provides that at least one RF branching circuit implements a Wilkinson divider circuit.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is noted that the term "neighboring" as used herein means "adjacent to" (e.g., next to), and "laterally" as used herein means in a sideways "direction" (e.g., a horizontal direction that is parallel to a plane of the substrate or panel). Also, "directly on" as used herein means "in contact with, without any intervening object or layer," while "over" as used herein means "adjacent to without necessarily being in contact with, with one or more intervening objects or layers or spaces."

As used herein, the terms "substantial" and "substantially" mean sufficient to achieve the stated purpose or value in a practical manner, taking into account any minor imperfections or deviations, if any, that arise from usual and expected process abnormalities that may occur during wafer fabrication, which are not significant for the stated purpose or value.

Although the invention is described herein with reference to specific embodiments, various modifications and changes can be made without departing from the scope of the present invention as set forth in the claims below. For example, additional or fewer RF die may be implemented in FIG. 7. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multi-die packaged semiconductor device comprising:
a panel of embedded dies including a plurality of radio frequency (RF) dies, wherein each RF die includes RF front-end circuitry, each RF die has an active side that includes a plurality of pads, each RF die has a back side exposed in a back side of the panel;
a plurality of antenna connectors formed on a subset of the plurality of pads of each RF die;
an array of antennas formed over a front side of the panel and connected to the plurality of antenna connectors;
a mold compound layer formed over the front side of the panel, the mold compound layer having a front surface;
a plurality of cavities formed in the front surface of the mold compound layer, wherein the antennas are located in the plurality of cavities and an air gap is formed in each cavity between an outer surface of each antenna and the mold compound layer to expose the outer surface of each antenna in the array of antennas, the air gap remaining in the multi-die packaged semiconductor device following manufacture of the multi-die packaged semiconductor device; and wherein at least a portion of each cavity is located between each antenna and the front side of the panel to expose an inner surface of each antenna.

2. The multi-die packaged semiconductor device of claim 1, wherein each cavity is further formed in the mold compound layer laterally around each antenna to laterally separate each antenna from the mold compound layer.

3. The multi-die packaged semiconductor device of claim 1, wherein at least a portion of the mold compound layer forms a structural support at an outer end of each antenna.

4. The multi-die packaged semiconductor device of claim 1, further comprising:
    a redistributed layer (RDL) structure formed on the front side of the panel, wherein the plurality of antenna connectors and the array of antennas are formed as part of the RDL structure.

5. The multi-die packaged semiconductor device of claim 4, wherein each cavity is further formed laterally around each antenna connector and antenna to laterally separate each antenna connector and antenna from dielectric material in the RDL structure.

6. The multi-die packaged semiconductor device of claim 4, wherein
    the RDL structure further comprises:
        a plurality of under bump metallization (UBM) pads formed on a remaining subset of the plurality of pads of each RF die, and
        a plurality of solder balls on the plurality of UBM pads; and
    wherein
        the mold compound layer is formed over and on the RDL structure,
        the mold compound layer laterally surrounds the plurality of solder balls, and
        a contact portion of the solder balls are exposed through the front surface of the mold compound layer.

7. The multi-die packaged semiconductor device of claim 6, wherein a plurality of openings are formed around the plurality of solder balls to laterally separate the contact portion of the solder balls from the mold compound layer.

8. The multi-die packaged semiconductor device of claim 4, wherein
    the panel of embedded dies further includes a plurality of RF branching dies located among the RF dies,
    each RF branching die has a set of pads on an active side of the RF branching die, and
    each RF die has a respective RF signal pad on the active side of the RF die.

9. The multi-die packaged semiconductor device of claim 8, wherein
    the front-end circuitry of each RF die is coupled to the respective RF signal pad,
    solder balls connected to the respective RF signal pads of the RF dies are configured to be attached to landing pads on a printed circuit board (PCB),
    solder balls connected to the set of pads of the RF branching dies are configured to be attached to other landing pads on the PCB, and
    a plurality of RF signal lines are implemented in the PCB as part of an RF signal path tree from the respective RF signal pads of the RF dies through the RF branching dies to a device master port.

10. The multi-die packaged semiconductor device of claim 8, wherein the RDL structure further comprises:
    a plurality of conductive traces that form RF signal lines of an RF signal path tree from the respective RF signal pads of the RF dies through the RF branching dies to a device master port.

11. The multi-die packaged semiconductor device of claim 1, further comprising:
    a redistributed layer (RDL) structure formed on the front side of the panel, wherein the RDL structure implements an RF signal path tree comprising:
        a plurality of RF branching circuits located among the RF dies, and
        a plurality of conductive traces that form RF signal lines of the RF signal path tree from an RF signal pad of each RF die through the RF branching circuits to a device master port.

12. The multi-die packaged semiconductor device of claim 1, further comprising:
    a metallization layer on the back side of the panel, which directly contacts the back side of each of the RF dies.

13. The multi-die packaged semiconductor device of claim 12, further comprising:
    a heat transfer system attached to the metallization layer with thermal interface material, wherein the heat transfer system comprises a heat pipe.

14. The multi-die packaged semiconductor device of claim 1, wherein the plurality of antenna connectors comprises one of a group comprising copper pillars and copper stud bumps.

15. The multi-die packaged semiconductor device of claim 8, wherein the set of pads of each RF branching die provides connections to an upstream port and two downstream ports.

16. The multi-die packaged semiconductor device of claim 15, wherein
    the RF branching dies are configured to split an RF signal present at the upstream port into two substantially equal RF signals at the downstream ports, and
    the RF dies are configured to transmit the RF signal on at least one antenna.

17. The multi-die packaged semiconductor device of claim 15, wherein
    the RF dies are configured to receive an RF signal on at least one antenna, and
    the RF branching dies are configured to combine the RF signal at the downstream ports into a single RF signal at the upstream port.

18. The multi-die packaged semiconductor device of claim 11, wherein at least one RF branching circuit implements a Wilkinson divider circuit.

19. The multi-die packaged semiconductor device of claim 6, wherein the plurality of solder balls are configured to be attached to landing pads on a printed circuit board (PCB).

* * * * *